United States Patent [19]

Yamamoto et al.

[11] Patent Number: 5,202,156
[45] Date of Patent: Apr. 13, 1993

[54] METHOD OF MAKING AN OPTICAL ELEMENT MOLD WITH A HARD CARBON FILM

[75] Inventors: Kiyoshi Yamamoto, Yokohama; Keiji Hirabayashi; Noriko Kurihara, both of Tokyo; Yasushi Taniguchi, Kawasaki; Keiko Ikoma, Yokohama, all of Japan

[73] Assignee: Canon Kabushiki Kaisha, Tokyo, Japan

[21] Appl. No.: 683,537

[22] Filed: Apr. 10, 1991

Related U.S. Application Data

[62] Division of Ser. No. 394,208, Aug. 15, 1989, Pat. No. 5,026,415.

[30] Foreign Application Priority Data

| Aug. 16, 1988 | [JP] | Japan | 63-202739 |
| Sep. 16, 1988 | [JP] | Japan | 63-230148 |
| Sep. 16, 1988 | [JP] | Japan | 63-230149 |
| Sep. 19, 1988 | [JP] | Japan | 63-232234 |
| Jul. 11, 1989 | [JP] | Japan | 1-177144 |

[51] Int. Cl.$^5$ .............. C03B 19/02; C03B 40/02; C03B 40/033
[52] U.S. Cl. .............. 427/135; 427/133; 427/249; 427/331; 427/372.2; 427/523; 427/577; 249/114.1; 249/134; 65/374.13; 65/374.15; 65/26; 65/305
[58] Field of Search .............. 65/374.1, 374.15, 60.6, 65/374.11, 286, 305, 26, 24, 374.13; 425/808; 249/114.1, 134; 106/38.27, 38.28; 427/249, 376.1, 331, 39, 45.1, 372.2, 133, 135

[56] References Cited

U.S. PATENT DOCUMENTS

| 4,490,229 | 12/1984 | Mirtich et al. | 204/192.15 |
| 4,569,738 | 2/1986 | Kieser et al. | 427/45.1 |
| 4,597,844 | 7/1986 | Hiraki et al. | 204/192.15 |
| 4,731,302 | 3/1988 | Weissmantel et al. | 428/472 |
| 4,783,361 | 11/1988 | Ovshinsky et al. | 427/40 |
| 4,816,338 | 3/1989 | Terasaki et al. | 427/376.1 |
| 4,844,785 | 7/1989 | Kitabatake et al. | 204/192.15 |
| 4,878,074 | 11/1989 | Wahu et al. | 427/133 |
| 4,882,827 | 11/1989 | Kusum et al. | 65/374.15 |
| 4,925,701 | 5/1990 | Jansen et al. | 427/45.1 |
| 4,935,303 | 6/1990 | Ikoma et al. | 427/45.1 |
| 5,013,579 | 5/1991 | Yamazaki | 427/45.1 |

FOREIGN PATENT DOCUMENTS

| 49-81419 | 8/1974 | Japan . |
| 5245613 | 9/1976 | Japan . |
| 55-11624 | 3/1980 | Japan . |
| 60246230 | 5/1984 | Japan . |
| 61183134 | 2/1985 | Japan . |
| 61281030 | 6/1985 | Japan . |
| 63203222 | 2/1987 | Japan . |
| 63-217384 | 7/1988 | Japan . |
| 63-44315 | 1/1989 | Japan . |
| 64-835291 | 3/1989 | Japan . |

OTHER PUBLICATIONS

F. W. Smith, "Optical Properties and Local Atomic Bonding In Hydrogenated Amorphous Carbon And Silicon-Carbon Alloys", *Materials Science Forum*, vols. 52 and 53, 1989, pp. 323–340.

*Primary Examiner*—W. Gary Jones
*Assistant Examiner*—Todd J. Burns
*Attorney, Agent, or Firm*—Fitzpatrick, Cella, Harper & Scinto

[57] ABSTRACT

This specification discloses a mold for use for press-molding an optical element, characterized in that at least the molding surface of a mold base material is coated with an a-C:H film containing 5–40 atom % of hydrogen therein and having a film density of 1.5 g/cm$^3$ or more, and with hard carbon film containing 0–5 atom % of hydrogen therein and having a spin density of $1 \times 10^{18}$ spin/cm$^3$ or less and a film density of 1.5 g/cm$^3$ or more.

1 Claim, 12 Drawing Sheets

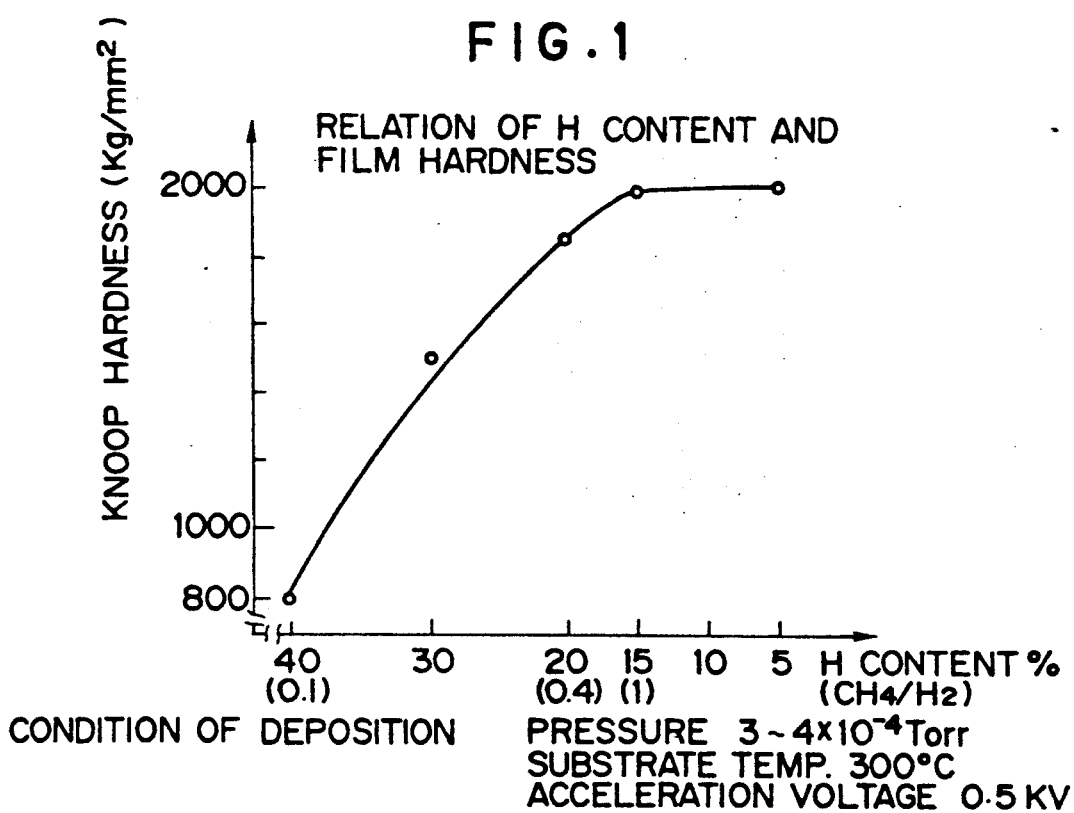
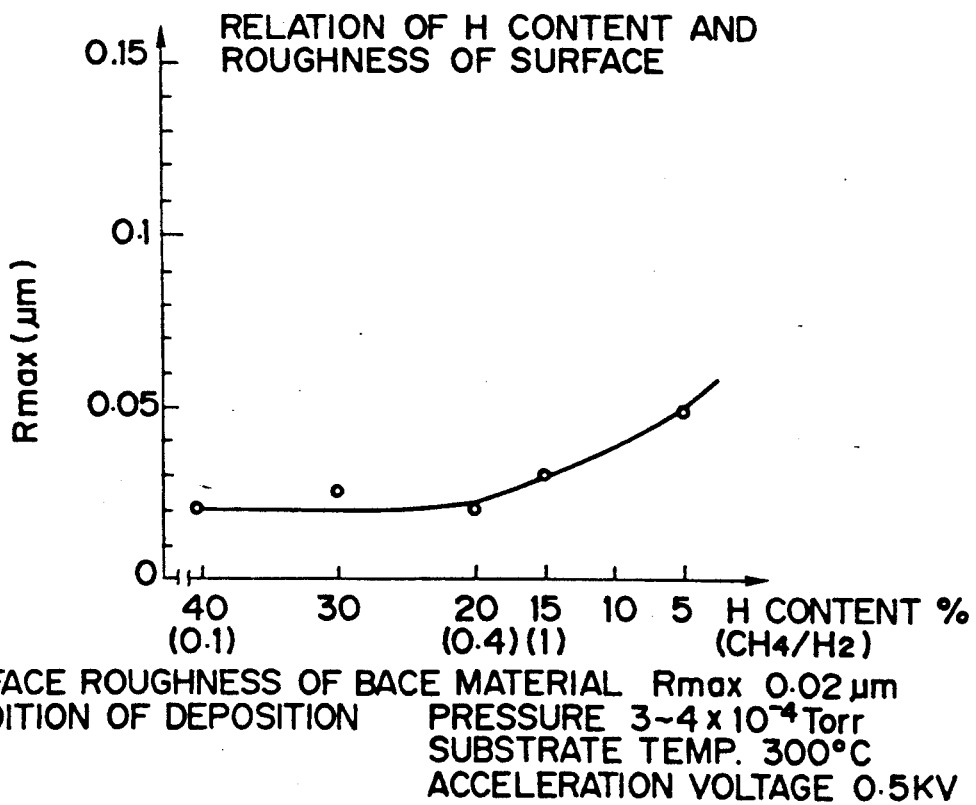

METHOD OF MAKING AN OPTICAL ELEMENT MOLD WITH A HARD CARBON FILM

This application is a division of application Ser. No. 07/394,208 filed Aug. 15, 1989, now U.S. Pat. No. 5,026,415.

BACKGROUND OF THE INVENTION

1. Field of the Invention

This invention relates to a mold used to manufacture an optical element formed of glass such as a lens or a prism by press-molding of a glass material, a method of manufacturing said mold, and a molding method using said mold.

2. Related Background Art

The technique of manufacturing a lens by press-molding of a glass material without requiring a polishing process has eliminated the complicated steps heretofore required in the manufacture of a lens and has made it possible to make a lens simply and inexpensively, and has recently been used in the manufacture of not only a lens but also other optical elements formed of glass such as prisms.

As the characteristics required of a mold used for the press-molding of such an optical element of glass, mention may be made of the excellence in hardness, heat resisting property, parting property, mirror surface workability, etc. Heretofore, numerous materials such as metals, ceramics and materials coated therewith have been proposed as mold of this type. Mentioning some examples, Japanese Laid-Open Patent Application No. 49-51112 proposes 13 Cr martensite steel, Japanese Laid-Open Patent Application No. 52-45613 proposes SiC and $Si_3N_4$, and Japanese Laid-Open Patent Application No. 60-246230 proposed a super-hard alloy coated with a precious metal.

Also, a method using a mold material consisting of carbon is proposed in Japanese Laid-Open Patent Application No. 49-81419, and methods using a mold material coated with carbon are proposed in Japanese Patent Publication No. 55-11624, Japanese Laid-Open Patent Application No. 63-203222, Japanese Laid-Open Patent Application No. 61-183134, Japanese Laid-Open Patent Application No. 61-281030 and Japanese Laid-Open Patent Application No. 64-83529.

However 13 Cr martensite steel suffers from the disadvantages that it is ready to be oxidized and that Fe is diffused in glass at a high temperature to thereby color the glass. SiC and $Si_3N_4$ are generally regarded as being difficult to be oxidized, but still suffers from the disadvantage that it is also oxidized at a high temperature and a film of $SiO_2$ is formed on the surface thereof and therefore fusion with glass is caused and further the workability of the mold itself is very bad due to the high hardness. The material coated with a precious metal is difficult to be fused, but it is very soft, and this leads to the disadvantage that it is ready to be injured and also ready to be deformed.

Also, the glassy carbon shown in Japanese Laid-Open Patent Application No. 49-81419 is weak in structural strength and therefore suffers from the disadvantage that during press molding, the shape of the mold surface is distorted or the deterioration of the surface roughness by flaws or the like occurs.

On the other hand, a mold coated with a carbon film has been proposed, whereas the carbon film is not limited to one kind, but from the viewpoint of crystal structure, it can be divided broadly into: (i) a diamond polycrystalline film; (ii) a graphite film or a glassy carbon film having a crystalline property; (iii) a diamond-like carbon film comprising a diamond crystallite phase and an amorphous phase; and (iv) a carbon film of high hardness composed of amorphous or microcrystal (an aggregate of crystallites) comprising $SP^2$ and $SP^3$-hybrided carbon.

The diamond polycrystal film mentioned under item (i) above is high in surface hardness and free of fusion with molded glass as well as low in reactiveness, but has the disadvantage that due to its being a polycrystalline film, it is inferior in surface roughness and the process of polishing the mold is difficult. The graphite film or the glassy carbon film mentioned under item (ii) above is low in hardness and structural strength and is inferior in the anti-oxidation property at high temperatures and the surface accuracy or the surface roughness is deteriorated, and this is not preferable.

Also, the diamond-like carbon film disclosed in Japanese Laid-Open Patent Application No. 63-203222 is made into a film by the use of the plasma chemical vapor deposition (=PCVD) method under a condition of relatively high substrate temperature, and is the diamond-like carbon film of item (iii) containing a diamond crystal phase. Therefore, the film is of inhomogeneous quality and it is difficult to obtain a smooth film which is high in the surface accuracy. Further, in the repetitive molding process, the mold surface is oxidized little by little, but the film of inhomogeneous quality is not generally uniformly oxidized and therefore has the disadvantage that the deterioration of the surface roughness is keen. In addition, the crystallization of the film is ready to progress due to molding at high temperature, and this leads to the disadvantage that the quality of the film is deteriorated and the hardness and adhesion are deteriorated.

A method using a diamond-like carbon film is disclosed in Japanese Laid-Open Patent Application No. 61-183134, but an amorphous film of this kind comprises $SP^2$ carbon and $SP^3$ carbon, and is difficult to clearly distinguish from a glassy carbon film or an amorphous carbon film chiefly comprising $SP^2$ carbon. So, hereinafter, as regards the carbon film of high hardness composed of amorphous or micro crystal comprising $SP^2$ and $SP^3$-hybrided carbon, a film containing a small amount of hydrogen in its composition will be referred to as a hard carbon film, and a film containing hydrogen to a certain concentration or greater will be referred to as a hydrogenated amorphous carbon film (a-C:H film).

The hard carbon film disclosed in Japanese Laid-Open Patent Application No. 1-83529 is sputtered at a relatively low substrate temperature and therefore is presumed to be an aggregate of diamond-like and graphite-like hyperfine particles, and is considered to be classified into the hard carbon film of item (iv) containing amorphous or microcrystal.

This film, when made, has no hydrogen atom contained therein and therefore is high in the homogeneity of film, but has the tendency that the better the surface smoothness, the greater the film become stress. This leads to the disadvantage that in the molding process, due to the release of the stress, the film is ready to peel off in a minute area or generally with the polishing flaw of the mold base material, the remaining polishing agent, dust, or the grain boundary or the partiality of composition of the mold base material as an occasion.

In addition, this film is not terminated by hydrogen atoms and therefore, much dangling bond is ready to be contained therein, and this leads to the disadvantage that the film reacts to glass and is fused thereto or causes a component in the glass to be reduced and deposited on the surface of the glass to thereby reduce the optical characteristic or the readiness with which it reacts to the oxygen in the atmosphere is liable to reduce the hardness and the adhesion by the deterioration resulting from oxidation.

SUMMARY OF THE INVENTION

It is the first object of the present invention to provide an optical element molding mold for heating and pressing a glass blank and press-molding it and in which at least the molding surface of the mold is coated with a carbon film, and a method of manufacturing such mold.

The present invention further proposes a method of molding an optical element by the use of said mold.

Particularly, to achieve the above first object, there are provided: (i) a mold used for press-molding an optical element, characterized in that at least the molding surface of the mold is coated with an a-C:H film containing 5–40 atom % of hydrogen and having a film density of 1.5 g/cm$^3$ or more; (ii) mold used for press-molding an optical element, characterized in that at least the molding surface of the mold is coated with a hard carbon film containing 0–5 atom % of hydrogen and having a spin density of $1 \times 10^{18}$ spin/cm$^3$ or less and a film density of 1.5 g/cm$^3$ or more; (iii) a method of manufacturing the mold of said item (i), characterized in that at least the molding surface of the mold is coated with a-C:H film by the plasma sputter deposition method or the plasma ion plating method made of a solid carbon source and in an atmosphere containing at least hydrogen; (iv) a method of manufacturing the optical element molding mold of said item (i), characterized in that at least the molding surface of the mold base material is coated with a-C:H film by the electron cyclotron resonance PCVD method or the ion beam deposition method; (v) a method of manufacturing the mold of said item (ii), characterized in that the heat treatment/annealing is carried out after a-C:H film is made; (vi) a method of manufacturing the mold of said item (v), characterized in that a-C:H film having a hydrogen content of 5–40 atom % and having a film density of 1.5 g/cm$^3$ or more is heat-treated; and (vii) an optical element molding method characterized by molding an optical element by the use of mold of said item (i) or (ii).

It is the second object of the present invention to propose mold characterized by being coated with an a-C:H film decreased in hydrogen content from the interface of the mold base material and film toward the surface.

In accordance with the present invention, there is provided an optical element molding mold used for press-molding an optical element formed of glass, characterized in that at least the molding surface of the mold base material is coated with a-C:H film decreased in hydrogen content from the interface of the mold base material and film toward the surface, and wherein the a-C:H film decreased in hydrogen content from the interface of the mold base material and film toward the surface is constructed of two layers of films differing in hydrogen content.

The present invention forms, on at least the molding surface of the mold base material, a-C:H film which is relatively great in hydrogen content and low in hardness, and gradually decreases the hydrogen content to thereby obtain an inactive a-C:H film which is high in hardness, smooth and small in coefficient of friction on the surface side (the side of the surface of contact with glass) and which does not react the lead or alkali element in a high interface of the mold and the film which is great in hydrogen content has the action of absorbing the internal stress of the film and the difference between the coefficients of thermal expansion of the mold and the film, thereby improving the mechanical strength typified by the sticking property of the a-C:H film formed on the mold.

As regards the a-C:H film, it is preferable that the hydrogen content in the interface of the film with the mold base material be 60 atom % or less. If the hydrogen content exceeds 60 atom %, there is the tendency that it becomes difficult to construct C-C network of the film. (If the hydrogen content exceeds 66 atom % (C:H=1:2), it is impossible to construct the film.) Also, it is preferable that the hydrogen content in the surface be 5 atom % or more. If the hydrogen content is less than 5 atom %, double bond increases within the film and therefore the film becomes a graphite-like film, and this leads to the tendency that the hardness of the film becomes low and the problem that the lead oxide in the glass component is reduced arises.

Also, where the a-C:H film is constructed of two layers of films differing in hydrogen content, the film thickness of the layer greater in hydrogen content (40–60 atom %) serves to absorb the internal stress of the film and the difference between the coefficients of thermal expansion of the mold and the film to thereby improve the adhesion of the film, but if the film thickness is too great, the characteristics (for example, the hardness) of the film greater in hydrogen content will become strong and therefore, it is preferable that the film thickness be 500–1000 Å. It is preferable that the film thickness of the layer smaller in hydrogen content (5–40 atom %) be 4000 Å or more to keep the film high in hardness and smooth, and if the film thickness of said layer exceeds 8000 Å, the influence of the internal stress of the film and the difference between the coefficients of thermal expansion of the mold and the film will become great and therefore, it is preferable that said film thickness be 4000–8000 Å.

As the base material of the optical element molding mold, mention may be made of ceramics excellent in mirror surface property and heat resisting property, besides super-hard alloy.

As a method of coating at least the molding surface of the mold base material with a-C:H film, mention may be made of the plasma chemical vapor deposition method (the PCVD method), the ion beam deposition method, the plasma sputter deposition method, the plasma ion plating method, the electron cyclotron resonance PCVD method or the like.

It is the third object of the present invention to propose a molding mold in which the molding surface of the mold base material is coated with an a-C:H film containing one or more kinds of elements selected from nitrogen and oxygen, in addition to hydrogen atoms.

Generally, some of films of a-Si (amorphous silicon) and amorphous carbon films have a great deal of dangling bond in the film. If there is much of such dangling bond in the amorphous carbon film formed on the mold base material, there will occur an active site which will cause reaction to lead oxide and alkali elements contained in molded glass during molding, and this will cause deposition of lead or the like. Accordingly, a slight amount of hydrogen or other element is added to decrease such dangling bond and is terminated to such dangling bond, whereby the dangling bond can be decreased.

Further, in connection with the above third object, the present invention proposes a mold in which the a-C:H film contain at least one kind of inert gas element selected from among He, Ne, Ar, Kr and Xe, instead of at least one kind of element selected from nitrogen and oxygen.

Furthermore, the present invention proposes a mold in which the a-C:H film contains at least one kind of halogen element selected from among F, Cl, Br and I, instead of at least one kind of element selected from nitrogen and oxygen.

In accordance with the present invention, there are provided: (1) a mold used for press-molding an optical element formed of glass, characterized in that at least the molding surface of the mold base material is coated with a-C:H film containing 5–40 atom % of hydrogen and carbon as the remainder and further, at least one kind of element selected from nitrogen and oxygen; (2) said mold in which the a-C:H film contains at least one kind of inert gas element selected from among He, Ne, Ar, Kr and Xe, instead of at least one kind of element selected from nitrogen and oxygen; (3) said mold in which the a-C:H film contains at least one kind of halogen element selected from among F, Cl, Br and I, instead of at least one kind of element selected from nitrogen and oxygen; and (4) said mold in which the a-C:H film contains at least one kind of element selected from among He, Ne, Ar, Kr and Xe, in addition to at least one kind of element selected from nitrogen and oxygen.

As the base material of the mold, mention may be made of ceramics excellent in mirror surface property and heat resisting property, besides super-hard alloy.

At least that surface of the mold base material which is in contact with a glass blank, i.e., the molding surface, is coated with the a-C:H film.

The composition of this a-C:H is 5–40 atom % of hydrogen and carbon as the remainder.

Here, it is for the following reason that the hydrogen content has been limited. The relations as shown in FIGS. 1 and 2 of the accompanying drawings are obtained between the hydrogen content in a-C:H and the hardness of the film and the roughness of the surface. As seen from FIG. 1, as hydrogen content increases, the hardness is reduced, and if the hydrogen content exceeds 40 atom %, Knoop hardness becomes less than 800 kg/mm$^2$ and desired film hardness becomes unobtainable. Also, as seen from FIG. 2, as the hydrogen content decreases, the roughness of the surface increases, and for less than 5 atom %, the roughness of the surface exceeds 0.05 μm at Rmax and a desired mirror surface property becomes unobtainable. The increase or decrease in the amount of hydrogen for obtaining the relations of FIGS. 1 and 2 has been effected by the use of the deposition apparatus of FIG. 5 of the accompanying drawings and with the acceleration voltage 500 V and the substrate temperature 300° C., among the conditions of making film, being constant and with the gas flow rate of CH$_4$ and H$_2$ changed.

It is preferable that the amount of nitrogen and oxygen contained in the a-C:H film of item (1) containing at least one kind of element selected from nitrogen and oxygen be within the range of 100–50,000 atom ppm. If it is outside the range of 100–50,000 atom ppm, the effect of improving the durability of the mold will decrease. This is considered to be attributable to the fact that within the range of 100–50,000 atom ppm, nitrogen and oxygen atoms contribute to the stabilization of the structure of the a-C:H film, but outside this range; part of the structure is destroyed or it becomes difficult to accept the distortion of the amorphous structure. The Knoop hardness of said film is of the order of 800–2000 kg/mm$^2$.

It is preferable that the amount of inert gas element contained in the a-C:H film of item (2) containing at least one kind of inert gas element selected from among He, Ne, Ar, Kr and Xe be within the range of 100–5,000 atom ppm. If it is outside the range of 100–5,000 atom ppm, the effect of improving the durability and wear resistance of the mold will decrease. This is considered to be attributable to the fact that particularly within the range of 100–5,000 atom ppm, the inert gas element differs in atomic diameter from carbon and oxygen atoms, whereby it accepts the distortion of the amorphous structure and contributes to the stabilization of the structure of the a-C:H film, and thus contributes to the improvement in the hardness of the film. The Knoop hardness of said film is of the order of 1000–3000 kg/mm$^2$.

The a-C:H film of item (3) containing at least one kind of halogen element selected from among F, Cl, Br and I reduces the wettability with respect to glass by its containing the halogen and therefore, the parting property during molding is improved, and during repetitive molding, the changes in the composition and structure of the a-C:H film are suppressed, and this leads to the improved durability of the mold.

It is preferable that the halogen content in the a-C:H film of item (3) be within the range of 100–50,000 atom ppm. If the halogen content is less than 100 atom ppm, the effect of improving he wettability tends to become low, and if the amount of halogen element exceeds 50,000 ppm, the halogen content which is not bonded in the film tends to increase and thereby spoil the durability of the film. The Knoop hardness of said film is 800 kg/mm$^2$ or more.

The halogen element may be distributed locally on the surface of the a-C:H film or may be uniformly distributed over the entire film.

The amount of nitrogen and oxygen contained in the a-C:H film of item (4) containing at least one kind of inert gas element selected from among He. Ne, Ar, Kr and Xe, in addition to at least one kind of element selected from nitrogen and oxygen, may preferably be within the range of 100–50,000 atom ppm, and the amount of inert gas element contained in said film may preferably be within the range of 100–5,000 atom ppm.

The a-C:H films of items (1)–(4) may contain not only amorphous structure, but also a small amount of crystallite. However, this crystallite can be a minute diamond grain of the order of 0.01–0.1 μm, but a crystallite whose diamond crystal surface appears clearly on the surface of the film is not preferable. Also, it is preferable that the crystallite do not contain graphite and multiple bond as far as possible, but the graphite and multiple bond may contain them if in a small amount.

It is preferable that the film thickness of the a-C:H film be 0.05–0.5 μm. If the film thickness is less than 0.05 μm, the component element of the mold base material will dissolve into glass during molding and the durability of the molding mold will tend to be reduced, and if the film thickness exceeds 0.5 μm, the distortion in the film will become great and the peeling-off of the film will readily to occur.

It is the fourth object of the present invention to provide the mold characterized in that at least the molding surface of the mold base material is coated with a-C:H film through an intermediate layer comprising a carbide of the base material component or an intermediate layer comprising the base material component and a-C:H.

In the molding process involving a heat shock, a-C:H film through the intermediate layer according to the present invention is made in order to prevent the stress of the a-C:H film and the difference between the coefficients of thermal expansion of the mold base material and the a-C:H film and prevent the grain boundary of said mold base material or a binder metal distributed in the grain boundary from causing the peeling-off of the a-C:H film made thereon.

Also, a-C:H film through the intermediate layer according to the present invention is made in order to prevent the binder metal as described above from being diffused in the a-C:H film and reacting to the metal and alkali component in glass to thereby cause them to be reduction and deposited or fused with the glass.

As the mold base material, a material containing a component element capable of producing a carbide is preferable, and mention may be made, for example, of super-hard alloy (containing CC as a chief component). SiC, AlN, cermet or the like.

The a-C:H film applied to at least the molding surface of the mold base material, i.e., the surface which contacts with glass, is formed with (1) an intermediate layer formed of a carbide of the base material component or (2) an intermediate layer formed of the base material component and a-C:H interposed between it and the mold base material. In the present invention, it is to be understood that the intermediate layers mentioned under items (1) and (2) above include, besides a layer whose boundary with the a-C:H film is clear, a layer which continuously varies in composition and structure and therefore whose boundary with the a-C:H film is not always clear.

The a-C:H layer may or may not contain diamond crystal, but does not contain a graphite crystal layer, and is a carbon film which is excellent in hardness, thermal stability and chemical stability as compared with glassy carbon and polymerized film, and includes a film generally called i-carbon film.

The layer thickness of said intermediate layer may preferably be of the order of 10–10,000 Å to improve the property of intimate contact between the mold and the film. Also, the film thickness of the a-C:H film, if less than 50 Å, tends to reduce the surface accuracy, and if it exceeds 5,000 Å, the distortion of the film will increase and the property of adhesion/adherence will tend to be reduced and therefore, the film thickness may preferably be of the order of 50–5,000 Å.

As a method of coating at least the molding surface of the mold base material with said intermediate layer and said a-C:H film, use can be made of one of various PVD methods and CVD methods such as the plasma deposition method, the ion beam deposition method, the plasma sputter deposition method, the plasma ion plating method and the electron cyclotron resonance PCVD method.

BRIEF DESCRIPTION OF THE DRAWINGS

FIGS. 1 to 12 illustrate an embodiment of a first invention.

FIG. 1 shows the relation between the hydrogen content in a-C:H and the hardness of the film.

FIG. 2 shows the relation between the hydrogen content and the roughness of the surface.

FIGS. 3 and 4 are cross-sectional views showing an embodiment of a mold according to the present invention, FIG. 3 showing the state before press-molding, and FIG. 4 showing the state after press-molding.

FIGS. 5, 6, 7, 8 and 12 are schematic views showing apparatuses used in a method of manufacturing the optical element molding mold according to the present invention, FIG. 5 showing an ion beam deposition apparatus, FIG. 6 showing an electron cyclotron resonance PCVD apparatus, FIG. 7 showing a sputter deposition apparatus, FIG. 8 showing an ion plating apparatus, and FIG. 12 showing an ion beam assist evaporation apparatus.

FIGS. 9 and 10 are cross-sectional views showing lens molding apparatuses using the mold according to the present invention, FIG. 9 showing the apparatus of the non-continuous molding type, and FIG. 10 showing the apparatus of the continuous molding type.

FIG. 11 is a graph showing the relation between time and temperature during lens molding.

DESCRIPTION OF THE PREFERRED EMBODIMENTS

1) Description of a First Invention

Figure 3:
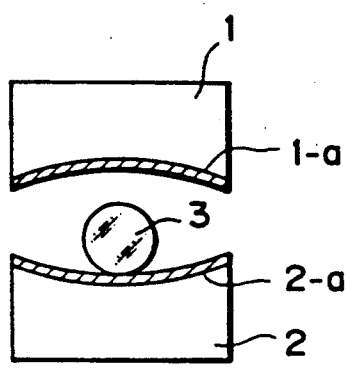

Description will first be made of a-C:H film containing 5–40 atom % of hydrogen and having a film density of 1.5 g/cm$^3$ or more.

Here, it is for the following reason that the amount of hydrogen has been limited. The relations shown in FIGS. 1 and 2 are obtained among the amount of hydrogen content in a-C:H and the hardness of the film and the roughness of the surface. It is seen from FIG. 1 that if the hydrogen content increases, the hardness is reduced and if the amount of hydrogen exceeds 40 atom %, Knoop hardness becomes less than 800 kg/mm$^2$ and desired film hardness becomes unobtainable. Also, it is seen from FIG. 2 that if the hydrogen content decreases, the roughness of the surface increases and for less than 5 atom %, the roughness of the surface exceeds 0.05 μm at Rmax and a desired mirror surface property becomes unobtainable. The increase and decrease in the hydrogen content for obtaining the relations of FIGS. 1 and 2 have been effected by the use of the film making apparatus of FIG. 5 with the acceleration voltage 500 V and the substrate temperature 300° C. among the conditions of making a film being constant and with the ratio of CH$_4$/H$_2$ gas flow rate being changed.

The reason why the film density has been limited is that if the film density is less than 1.5 g/cm$^3$, graphite crystallization is ready to occur during molding and the deterioration of the roughness of the surface and the hardness is quick and inferiority in durability occurs.

It is preferable that the film hardness be greater than the degree which will not cause scratches, plastic deformation during the molding with a glass blank, and basically it is preferable that the film hardness be equal to or greater than the hardness 800 kg/mm$^2$ of the glass blank itself.

Also, to hold the sufficient adhesion/adherence and mechanical strength of the mold base material and the film under the temperature condition during molding, it is preferable that the coefficient of thermal expansion a of the film be within the range of $1\times10^{-6} \leq a \leq 1\times10^{-5}$ [K$^{-1}$].

Further, it is preferable that the film thickness of the a-C:H film be 0.05–0.5 μm. If the film thickness is less than 0.05 μm, the component element of the mold base material tends to dissolve into glass and reduce the durability of the mold, and if the film thickness exceeds 0.5 μm, the distortion in the film becomes great and the peeling-off of the film becomes ready to occur.

Description will now be made of a method of manufacturing a mold which is coated with a-C:H film.

As a method of coating at least the molding surface of the mold with a hard carbon film, mention may be made of the plasma deposition method, the ion beam deposition method, the plasma sputter deposition method, the plasma ion plating method, the electron cyclotron resonance PCVD method or the like.

According to the plasma sputter method or the plasma ion plating method, as compared with the ion beam sputter method of Japanese Laid-Open Patent Application No. 61-183134, the deposition rate is high (in the ion beam sputter method, the deposition rate is 0.1–0.2 μm/hr, whereas in the present method, the deposition rate is 1 μm/hr or higher) and moreover, a film can be made at a uniform thickness over a wide area. Further, in the electron cyclotron resonance PCVD method, the deposition rate is as high as 10 μm/hr. Also, the ion beam deposition method can adjust the hydrogen content by changing the acceleration voltage of an ion beam.

Description will now be made of a hard carbon film containing 0–5 atom % of hydrogen and having a spin density of $1\times10^{18}$ spin/cm$^3$ or less and a film density of 1.5 g/cm$^3$ or higher.

Where molding is effected at a high temperature, or where in the molding process, glass containing an element such as lead which is ready to be reduced and deposited is used in the interface between the molded glass and the mold, or where molding is effected under a condition in which reduction and deposition are ready to occur, a hard carbon film containing 5 atom % or less of hydrogen in the film or containing no hydrogen in the film and having a spin density of $1\times10^{18}$ spin/cm$^3$ or less is preferable. If the hydrogen content exceeds 5 atom %, the surface of the molded glass will become cloudy due to a reduced metal particularly during the several first moldings, and this is not preferable from the viewpoints of the optical characteristic and the appearances. If the spin density exceeds $1\times10^{18}$ spin/cm$^3$, peeling-off of the film will occur due to the heat shock resulting from molding, and this is not preferable.

The film density of said hard carbon film is 1.5 g/cm$^3$ or higher. If the film density is less than 1.5 g/cm$^3$, deterioration of the hardness and the roughness of the surface will occur due to repetitive molding, and this will result in inferior durability.

Said hard carbon film does not contain the diamond and graphite crystal of the size which can be detected by the X-ray diffraction method.

Said hard carbon film may contain a slight amount of one or more kinds of elements of other elements than hydrogen, such as N, O, He, Ne, Ar, Kr, Xe, F, Cl, Br and I.

Also, the roughness of the surface of said hard carbon film may preferably be Rmax 0.05 μm or less, and if it exceeds Rmax 0.05 μm, the surface accuracy of the molded glass will become low and the durability of the mold will become low, and this is not preferable.

The film thickness of said hard carbon film may preferably be 100 Å–20000 Å, and if the film thickness is less than 100 Å, the reactivity to glass will occur, and if the film thickness exceeds 20000 Å, peeling-off of the film will occur, and this is not preferable.

The film hardness of said hard carbon film may be higher than the hardness of the molded glass, and may preferably be 800 kg/mm$^2$ or more. If the film hardness is less than 800 kg/mm$^2$ the surface accuracy of the molded glass will tend to become insufficient, and this is not preferable.

Description will now be made of a method of manufacturing the mold of the present invention which is coated with the hard carbon film.

Said hard carbon film can be produced by heat-treating the aforementioned a-C:H film containing 5–40 atom % of hydrogen and having a film density of 1.5 g/cm$^3$ or more.

The reason why it is preferable to use a-C:H film containing 5–40 atom % of hydrogen in the heat treatment will hereinafter be described.

Generally in a hard carbon film, the film hardness is high and the degree of cross-link of the carbon-carbon network is high, and in a smooth amorphous film, the stress is high, and a film in which the stress is too high becomes the cause of the film peeling off in the whole surface or a minute area with the polishing flaw of the base material, the grain boundary, the dust or the like having adhesion to the film before film making as an occasion. If the peeling-off of the film is such that the film peels off in a minute area of the order of several tens to several hundred $\mu$m, if not in the whole surface, due to a reduced adhesion, the roughness of the surface of the molded glass will increase though locally, and this will become the cause of the molded glass becoming cloudy and thus will pose a problem in terms of the optical characteristic and appearances. So, even if the degree of cross-link of the carbon-carbon network is controlled with a view to control the stress, if unbonded hands which could not be bonded to carbon are present in the form of dangling bond in the film, the effect of alleviating the stress will be small and also, this will provide an active site for reacting to oxygen, and this is not preferable.

That is, a film in which hydrogen has been made into a film to 0–5 atom % immediately after the making of the film generally has much dangling bond, and when the film is removed from a chamber for preservation after the making of the film or is heated, the film is liable to peel off or be oxidinized and deteriorated, and this is not preferable.

Also, if a film in which hydrogen is 0–5 atom % and the stress has been alleviated is formed in the film making process, the film will become inhomogeneous in quality and crystallized and will exhibit a tendency toward the reduced roughness of the surface and the reduced structural strength of the film, and this is not preferable.

So, even if the hydrogen content is increased to terminate the dangling bond, if the hydrogen content exceeds 40 atom %, the degree of cross-link of the carbon-carbon network will be reduced too much and particularly at the molding temperature, the hardness of the film and the roughness of the surface of the film will be reduced or glass will be fused, and this is not preferable.

If a-C:H film having a film density of less than 1.5 g/cm$^2$ is used in the heat treatment, graphite crystallization is ready to occur during the heat treatment and the deterioration of the roughness of the surface and the hardness of the hard carbon film obtained is quick and the film is inferior in durability, and this is not preferable.

Also, due to the heat treatment, the roughness of the surface exhibits a tendency toward an increase and therefore, to obtain a mold material of good surface roughness having moldability sufficiently, it is preferable that the roughness of the surface of the a-C:H film before the heat treatment be less than Rmax 0.05 $\mu$m.

Also, such a-C:H film in which the hydrogen content has an inclination in the direction of thickness can be subjected to heat treatment to thereby form said hard carbon film.

The a-C:H film used in the heat treatment can be made by the conventional PCVD method, ion plating method, ion beam deposition method, sputter deposition method or the like, and the control of the hydrogen content can be accomplished by adjusting the mixture ratio of carbon gas source and hydrogen gas source, substrate temperature, pressure, the kinetic energy of the ion flow concerned in film making. There are also methods using hydrogen plasma assist and hydrogen ion beam assist.

The heat treatment conditions differ depending on the kind of the glass to be molded, the molding temperature and the qualities of film such as film density and the hydrogen content, and the lower limit of the heat treatment temperature may preferably be 400° C. or the upper limit of the molding temperature may preferably be 750° C. If the heat treatment temperature is less than 400° C., the effect of dehydrogenation and the effect of obtaining good molded glass from the first molding will be difficult to obtain. If the heat treatment temperature exceeds 750° C., deterioration such as the oxidation of the a-C:H film and graphite crystallization will progress and the structural strength of the hard carbon film will be deteriorated, and this is not preferable. More preferably, the heat treatment temperature is above 500° C. and below 650° C.

The heat treatment atmosphere may preferably be inactive or inert gas such as He, Ne, Ar, Kr, Xe or the like or of N$_2$ or H$_2$ gas or a mixture of two or more kinds of gases of these gases or in a reduced pressure thereof, and the partial pressure of oxygen in the atmosphere may preferably be $1 \times 10^{-1}$ Torr or less. If the partial pressure exceeds $1 \times 10^{-1}$ Torr, the a-C:H film will be oxidized and the thickness of the hard carbon film will decrease too much or the hardness of the film and the structural strength of the film will be reduced, and this is not preferable.

The heat treatment can be carried out in the same film deposition apparatus subsequently to film deposition or can be carried out in the molding apparatus before molding. As a further alternative, the heat treatment may be carried out in another heat treatment furnace after film making.

As the mold base material of the mold, mention may be made of super-hard alloy or ceramic materials excellent in mirror surface property and heat resisting property.

For example, mention may be made of super-hard alloy obtained by sintering WC by the use of a binder such as Co, Ni, TiN, TiC or TaC, or cermet of the TiC-Ni line, the TiC-Co line, the Al$_2$O$_3$-Fe line or the like, or ceramics such as Si$_3$N$_4$, SiC and Al$_2$O$_3$.

Specific embodiments of the present invention will hereinafter be described with reference to the drawings.

Figure 4:
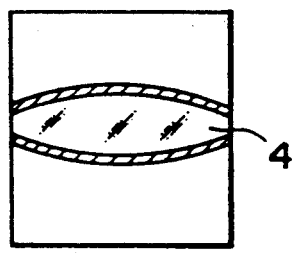

FIGS. 3 and 4 show an embodiment of the mold according to the present invention.

FIG. 3 shows the state before the press-molding of an optical element, and FIG. 4 shows the state after the press-molding of the optical element. In FIG. 3, the reference numerals 1 and 2 designate mold base materials, the reference characters 1-a and 2-a denote a-C:H films or hard carbon films formed on the molding surfaces of the mold base materials which contact with a glass blank, and the reference numeral 3 designates the glass blank, and in FIG. 4, the reference numeral 4 denotes the optical element.

By press-molding the glass blank placed between the molds as shown in FIG. 3, the optical element 4 such as a lens is molded as shown in FIG. 4.

Embodiment 1

The ion beam deposition method has been used as a method of forming the a-C:H film. An deposition apparatus used in the present embodiment is shown in FIG. 5.

Figure 5:
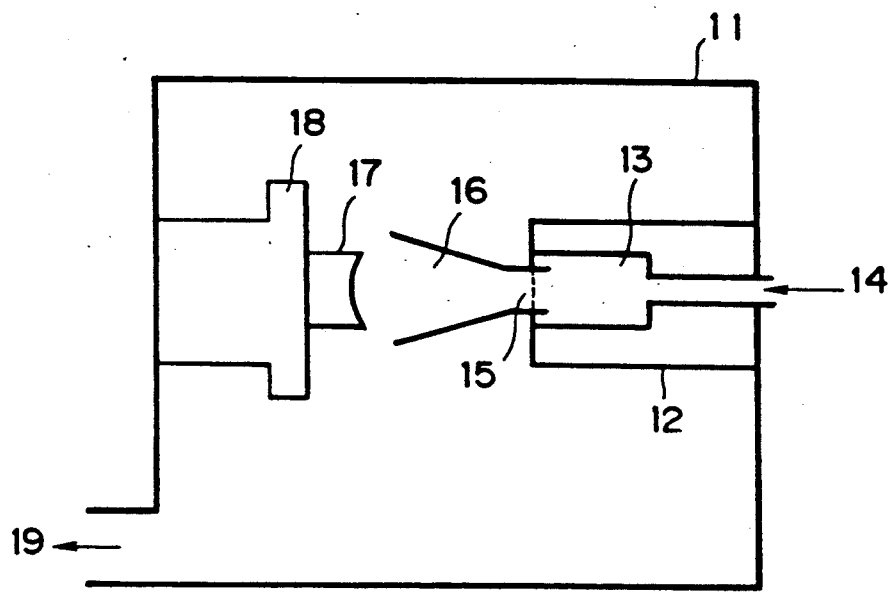

In FIG. 5, the reference numeral 11 designates a vacuum chamber, the reference numeral 12 denotes an ion beam apparatus, the reference numeral 13 designates an ionization chamber, the reference numeral 14 denotes a gas inlet port, the reference numeral 15 designates an ion extractive grid, the reference numeral 16 denotes an ion beam, the reference numeral 17 designates a mold substrate, the reference numeral 18 denotes a substrate holder and a heater, and the reference numeral 19 designates an exhaust outlet. When the a-C:H film is to be formed, the mold base material 17 having its surface cleaned by an organic solvent is installed on the holder 18 and the air is exhausted through the exhaust outlet 19 to thereby make the interior of the chamber 11 vacuum. The mold base material 17 is heated to 300° C. and a source gas of $CH_2 + H_2$ is introduced into tee chamber through the gas inlet port 14 ($CH_4/H_2 = 0.1$). The source gas is ionized in the ionization chamber 13 of the ion beam apparatus 12, and a voltage of 300 V is applied to the ion extractive grid 15 to thereby draw out an ion beam, which is applied to the base material 17 to a predetermined film thickness. In the manner described above, a mold coated with a-C:H film was manufactured.

An example in which press-molding of a glass lens has been effected by the mold according to the present invention will now be described in detail. Table 1 below shows the kinds of the mold material used in the experiment.

TABLE 1

| No. | Coating material | Base material |
|---|---|---|
| 1 | None | WC(90%) + Co(10%) |
| 2 | None | SiC |
| 3 | SiC | WC(90%) + Co(10%) |
| 4 | a-C:H | WC(90%) + Co(10%) |
| 5 | a-C:H | SiC |

Nos. 1-3 are comparative materials, and Nos. 4-5 are materials proposed by the present invention. Superhard alloy WC(90%)+Co(10%) and sintered SiC were used as the base material. A lens molding apparatus used in the above-described example is shown in FIG. 9.

Figure 9:
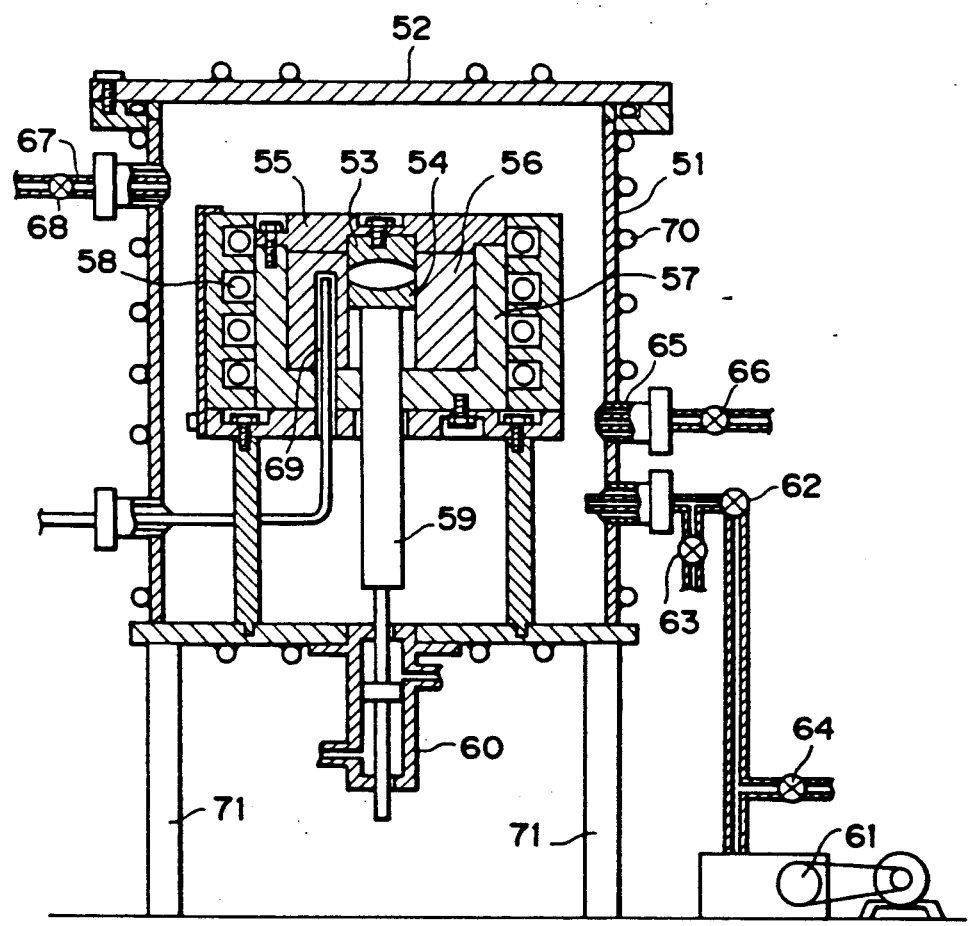

In FIG. 9, the reference numeral 51 designates a vacuum chamber, reference numeral 52 denotes the lid thereof, the reference numeral 53 designates an upper mold for molding an optical element, the reference numeral 54 denotes a lower mold, the reference numeral 55 designates an upper mold keeper for holding down the upper mold, the reference numeral 56 denotes a mold holder, the reference numeral 57 designates a mold holder, the reference numeral 58 denotes a heater, the reference numeral 59 designates a thrust-up bar for thrusting up the lower mold, the reference numeral 60 denotes an air cylinder for operating the thrust-up bar, the reference numeral 61 designates a rotary oil pump, the reference numerals 62, 63 and 64 denote valves, the reference numeral 65 designates an inert gas inlet pipe, the reference numeral 66 denotes a valve, the reference numeral 67 designates a vent pipe, the reference numeral 68 denotes a valve, the reference numeral 69 designates a thermocouples, the reference numeral 70 denotes a water cooling pipe, and the reference numeral 71 designates a base plate for supporting the vacuum chamber.

The process of making a lens will now be described. The base material of the mold is first worked into a predetermined shape, and the lens molding surface thereof is polished into a mirror surface. A coating of SiC is then formed by the ion plating method. Also, a coating of a-C:H film containing 40 atom % of hydrogen is constructed by the ion beam chamber method. The film thickness was 0.1 μm. Optical glass of the flint line (SF14) is then regulated to a predetermined amount, and a glass blank made into a spherical shape is placed in the cavity of the mold and is installed in the apparatus.

The mold in which the glass blank is placed is installed in the apparatus, and then the lid 52 of the vacuum chamber 51 is closed, and water is flowed into the water cooling pipe 70 and an electric current is supplied to the heater 58. At this time, the valve 66 for nitrogen gas and the vent valve 68 are closed and the exhaust system valves 62, 63 and 64 are also closed. The oil rotary pump 61 is rotating at all times.

The valve 62 is opened to start exhaust, and when $10^{-2}$ Torr or less is reached, the valve 62 is closed, and the valve 66 is opened to introduce nitrogen gas from a bomb into the vacuum chamber. When a predetermined temperature is reached, the air cylinder 60 is operated to press at a pressure of 10 kg/cm² for five minutes. After the pressure is removed, cooling is effected until the cooling speed becomes less than the transition point at −5° C./min, whereafter cooling is effected at a speed above −20° C./min, and when the temperature falls to 200° C. or less, the valve 66 is closed and the vent valve 63 is opened to introduce air into the vacuum chamber 51. The lid 52 is then opened, the upper mold keeper is removed and the molded article is taken out.

Figure 11:
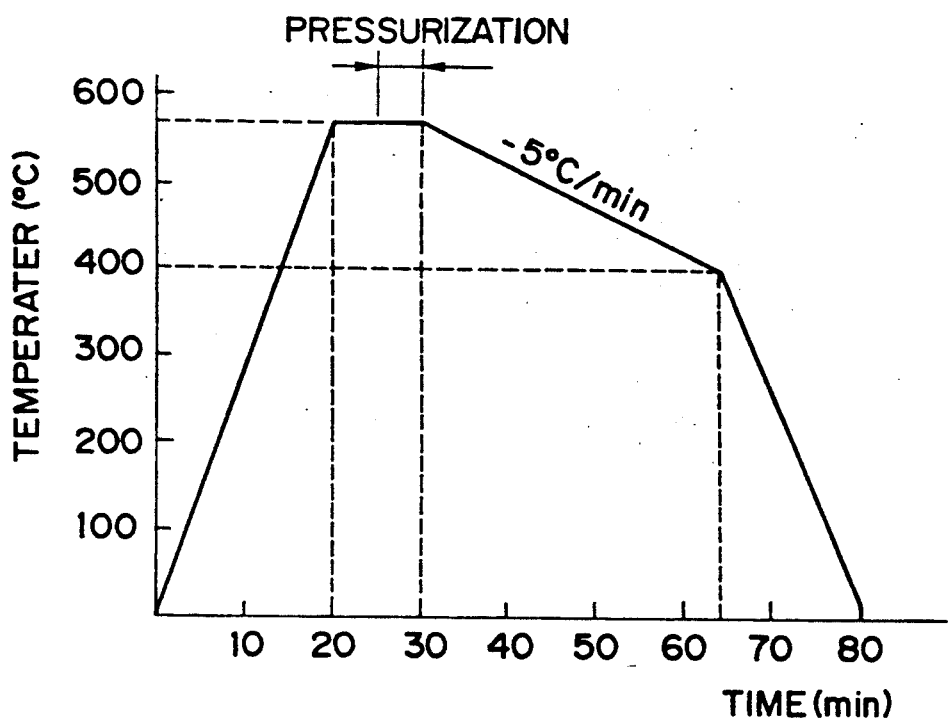

In the manner described above, the lens 4 shown in FIG. 4 was molded by the use of optical glass SF14 of the flint line (softening point Sp=586° C. and transition point Tg=485° C.). The then molding condition, i.e., the time-temperature relation, is shown in FIG. 11.

Subsequently, the roughness of the surface of the molded lens and the roughness of the surface of the mold before and after molding were measured. The result is shown in Table 2 below.

TABLE 2

| No. | Coating | Base material | Roughness of surface Rmax (μm) Lens | Roughness of surface Rmax (μm) Mold (before molding) | Roughness of surface Rmax (μm) Mold (after molding) | Parting property |
|---|---|---|---|---|---|---|
| 1 | None | WC(90%) + Co(10%) | 0.04 | 0.02 | 0.03 | Good |
| 2 | None | SiC | — | 0.04 | — | Fused |
| 3 | SiC | WC(90%) + Co(10%) | — | 0.02 | — | Fused |
| 4 | a-C:H | WC(90%) + Co(10%) | 0.03 | 0.02 | 0.02 | Good |
| 5 | a-C:H | SiC | 0.05 | 0.04 | 0.04 | Good |

Subsequently, with respect to Nos. 1, 4 and 5 which did not cause fusion, molding was effected 200 times by the use of the same mold, whereafter the roughness of the surface was measured. The result is shown in Table 3 below.

TABLE 3

| No. | Roughness of surface Rmax (μm) Lens | Roughness of surface Rmax (μm) Mold (after 200 times) |
|---|---|---|
| 1 | 0.14 | 0.15 |
| 4 | 0.03 | 0.02 |
| 5 | 0.05 | 0.04 |

As is apparent from the results shown in Tables 2 and 3 above, the mold material according to the present invention is excellent in the parting property with respect to glass, and even if it is repetitively used, deterioration of the surface is very little as compared with the conventional mold material.

Embodiment 2

Film making was done by the use of the same deposition apparatus as that in Embodiment 1 and with the deposition conditions changed. With the ratio of the mixed gases being $CH_4/H_2=1$ and the substrate temperature being 500° C. and the extractive voltage being 250 V, there was obtained a-C:H film containing 15 atom % of hydrogen and having a film thickness of 0.5 μm.

An example in which press-molding of a glass lens was effected by the above-described mold will now be described in detail.

Figure 10:
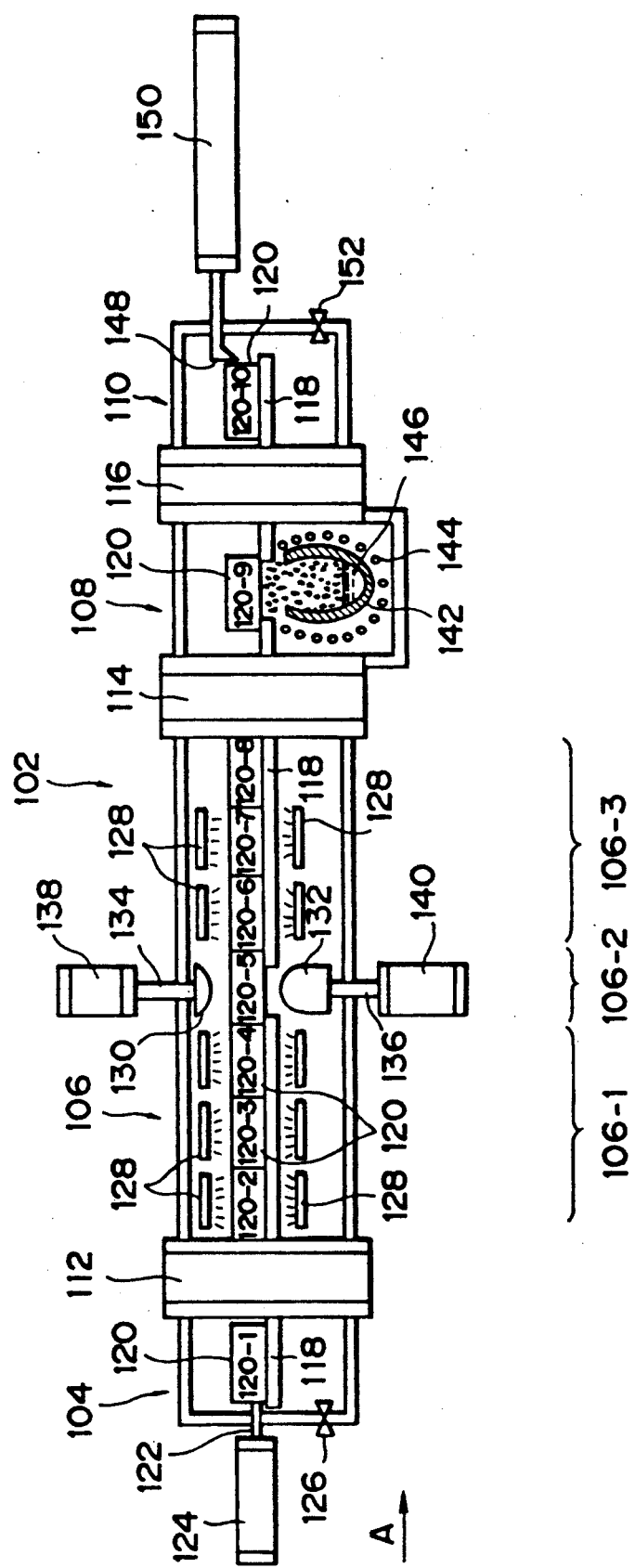

In FIG. 10, the reference numeral 102 designates a molding apparatus, the reference numeral 104 denotes a replacement chamber for taking-in, the reference numeral 106 designates a molding chamber, the reference numeral 108 denotes an evaporation chamber, and the reference numeral 110 designates a replacement chamber for taking-out. The reference numerals 112, 114 and 116 denote gate valves, the reference numeral 118 designates a rail, and the reference numeral 120 denotes a pallet conveyed on the rail 118 in the direction of arrow A. The reference numerals 124, 138, 140 and 150 designate cylinders, and the reference numerals 126 and 152 denote valves. The reference numeral 128 designates heaters arranged in the molding chamber 106 along the rail 118.

The interior of the molding chamber 106 is divided into a heating zone 106-1, a press zone 106-2 and a gradually cooling zone 106-3 along the direction of conveyance of the pallet. In the press zone 106-2, an upper mold member 130 for molding is fixed to the lower end of the rod 134 of the cylinder 138 and a lower mold member 132 for molding is fixed to the upper end of the rod 136 of the cylinder 140. These upper and lower mold members 130 and 132 are the mold members of FIG. 3 according to the present invention. A container 142 containing an evaporation materials 146 therein and heaters 144 for heating this container are disposed in the evaporation chamber 108.

Optical glass of the flint line (SF14, the softening point Sp=586° C., the glass transition point Tg=485° C.) was roughly worked into a predetermined shape and dimensions, whereby a blank for molding was obtained.

The glass blank was mounted on the pallet 120, and was placed at a position 120-1 in the replacement chamber 104 for taking-in, and the pallet at this position was pushed in the direction of arrow A by the rod 122 of the cylinder 124 and was conveyed to a position 120-2 in the molding chamber 106 beyond the gate valve 112, whereafter in the same manner, pallets were newly successively placed into the replacement chamber 104 for taking-in at predetermined timing, and each time, the pallets were successively conveyed to positions 120-2→ ... →120-8 in the molding chamber 106. In the meantime, in the heating zone 106-1, the glass blank was gradually heated by the heaters 128 and was rendered to the softening point or above at the position 120-4, whereafter it was conveyed to the press zone 106-2, whereupon the cylinders 138 and 140 were operated and the glass blank was pressed by the upper mold member 130 and the lower mold member 132 with a pressure of 10 kg/cm² for five minutes, whereafter the pressing force was released and the glass blank was cooled to the glass transition point or below, whereafter the cylinders 138 and 140 were operated to thereby part the upper mold member 130 and the lower mold member 132 from the molded glass article. During said pressing, the pallet was utilized as a side mold member for molding. Thereafter, the molded glass article was gradually cooled in the gradually cooling zone 106-3. The molding chamber 106 was filled with inert gas.

The pallet which arrived at the position 120-8 in the molding chamber 106 was then conveyed to a position 120-9 in the evaporation chamber 108 beyond the gate valve 114. Although usually vacuum evaporation is effected here, such evaporation was not effected in the present embodiment. In the next cycle of conveyance, the pallet was conveyed to a position 120-10 in the replacement chamber 110 for taking-out beyond the gate valve 116. In the next cycle of conveyance, the cylinder 150 was operated and the molded glass article was taken out of the molding apparatus 102 by the rod 148.

The roughness of the molding surfaces of the mold members 130 and 132 before and after the press-molding as described above, the roughness of the optical surface of the molded optical element and the parting property of the molded optical element with respect to the mold members 130 and 132 are shown in Table 4 below.

TABLE 4

| No. | Coating | Base material | Roughness of surface Rmax (μm) | | | Parting property |
| | | | Lens | Mold (before molding) | Mold (after molding) | |
| --- | --- | --- | --- | --- | --- | --- |
| 1 | None | WC(90%) + Co(10%) | 0.04 | 0.02 | 0.03 | Good |
| 2 | None | SiC | — | 0.04 | — | Fused |
| 3 | SiC | WC(90%) + Co(10%) | — | 0.02 | — | Fused |
| 4 | a-C:H | WC(90%) + Co(10%) | 0.03 | 0.03 | 0.03 | Good |
| 5 | a-C:H | SiC | 0.05 | 0.04 | 0.04 | Good |

Subsequently, with respect to Nos. 1, 4 and 5 which did not cause fusion, press-molding was effected 10,000 times or end by the use of the same mold members. The roughness of the molding surfaces of the mold members 130 and 132 in this case and the roughness of the optical surface of the molded optical element are shown in Table 5 below.

TABLE 5

| No. | Number of molding | Roughness of surface Rmax μm | |
| | | Lens | Mold |
| --- | --- | --- | --- |
| 1 | 200 | 0.14 | 0.15 |
| | 1000 | 0.20 | 0.21 |
| | 5000 | 0.23 | 0.24 |
| | 10000 | 0.26 | 0.27 |
| 4 | 200 | 0.03 | 0.03 |
| | 1000 | 0.03 | 0.03 |
| | 5000 | 0.03 | 0.03 |
| | 10000 | 0.04 | 0.03 |
| 5 | 200 | 0.05 | 0.04 |
| | 1000 | 0.05 | 0.04 |

TABLE 5-continued

| No. | Number of molding | Roughness of surface Rmax μm | |
|---|---|---|---|
| | | Lens | Mold |
| | 5000 | 0.05 | 0.04 |
| | 10000 | 0.05 | 0.05 |

As described above, in the present embodiment, even the repetitive use of the mold for press-molding could maintain good surface accuracy sufficiently and an optical element of good surface accuracy could be molded without causing fusion.

Embodiment 3, Comparative Example a-C:H films having a film thickness of 0.03-0.60 μm were heaped up on the surface of a mold base material comprising WC 90% and Co 10% by the ECR-PCVD method. The ECR-PCVD apparatus is of the cavity type shown in FIG. 6, and a magnetic field is applied to a cavity 21 by an electromagnet 22, and a microwave is introduced from a microwave introduction window 24 through a waveguide tube 23 and gas is introduced from a gas inlet port 27 into the cavity, and the gas is excited.

Figure 6:
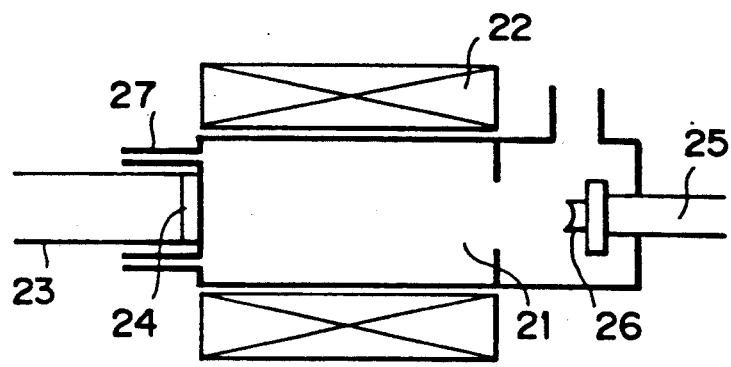

The magnitude of the magnetic field was set so as to be 2000 gauss at the microwave introduction window and 875 gauss on the surface of the mold. A mold 26 supported on a mold holder 25 was installed outside the cavity, as shown in FIG. 6. Ethylene (5 SCCM) and hydrogen (20 SCCM) were introduced from the gas inlet port 27 into the ECR-PCVD apparatus, and the pressure, the microwave power and the mold surface temperature were set to $2 \times 10^{-3}$ Torr, 500 W and 300° C., respectively. When under such conditions, deposition was effected for three minutes, four minutes, seven minutes, ten minutes, twenty minutes and twenty-five minutes, respectively, a-C:H films having film thickness of 0.03, 0.05, 0.10, 0.22, 0.50 and 0.60 μm, respectively, were formed on the surface of the mold base material. When the hydrogen content in these films was measured by combustion analysis, it was 30 atom %. The Knoop hardness was 1500 kg/mm².

Subsequently, by the use of molds coated with the a-C:H films, respectively, having the six kinds of film thicknesses described above, press-molding of glass lenses was effected in the same manner as in Embodiment 1. After molding was effected, once, the roughness of the surface was measured. The result is shown in Table 6 below.

TABLE 6

| No. | Film thickness (μm) | Roughness of surface Rmax (μm) | | |
|---|---|---|---|---|
| | | Lens | Mold (before molding) | Mold (after molding) |
| 6 | 0.03 | 0.08 | 0.02 | 0.08 |
| 7 | 0.05 | 0.03 | 0.02 | 0.02 |
| 8 | 0.10 | 0.03 | 0.02 | 0.02 |
| 9 | 0.22 | 0.03 | 0.02 | 0.02 |
| 10 | 0.50 | 0.03 | 0.02 | 0.02 |
| 11 | 0.60 | 0.03 | 0.02 | 0.02 |

Subsequently, with respect to the respective molds having film thicknesses of 0.05-0.60 μm, molding was effected 10,000 times in the same manner as in Embodiment 2, whereafter the roughness of the surface was measured. The result is shown in Table 7 below.

TABLE 7

| No. | Film thickness (μm) | Roughness of surface Rmax (μm) | |
|---|---|---|---|
| | | Lens | Mold |
| 7 | 0.05 | 0.05 | 0.04 |
| 8 | 0.10 | 0.04 | 0.03 |
| 9 | 0.22 | 0.04 | 0.03 |
| 10 | 0.50 | 0.04 | 0.03 |
| 11 | 0.60 | — | Film peeled. |

Embodiment 4

A method of manufacturing a mold by the plasma sputter deposition method will hereinafter be described with reference to FIG. 7.

Figure 7:
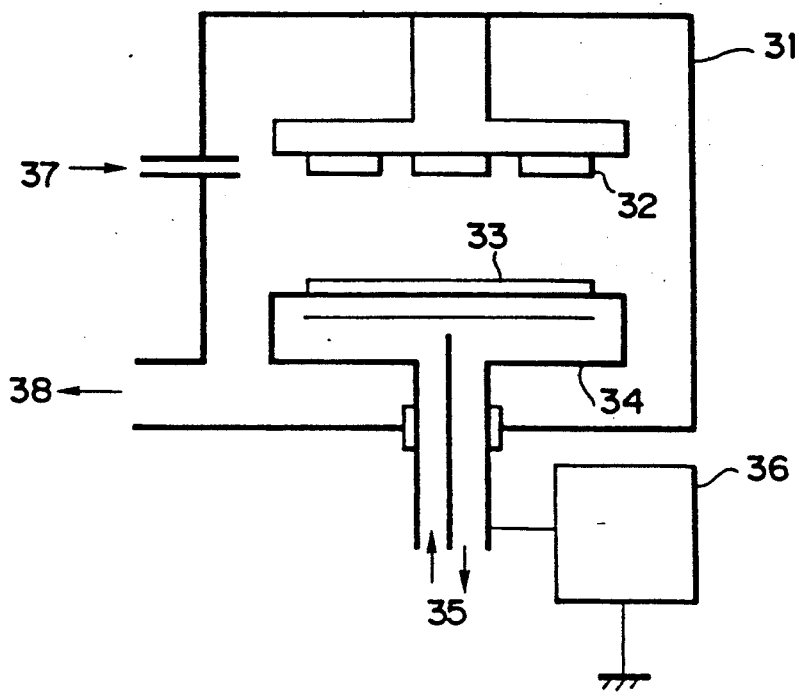

FIG. 7 shows a RF sputtering apparatus used in the present embodiment. The reference numeral 31 designates a vacuum chamber, the reference numeral 32 denotes a mold base material comprising super-hard alloy and a substrate holder, the reference numeral 33 designates the target of a solid carbon source (usually graphite), and the reference numeral 34 denotes a target holder which is cooled by cooling water passing through inlet and outlet ports 35. The reference numeral 36 designates a RF power supply for applying a RF (or rf) to the target holder and a matching device. The reference numeral 37 denotes a gas inlet port, and the reference numeral 38 designates an exhaust port connected to an exhaust apparatus, not shown. It is to be understood that the atmosphere in which the a-C:H film is formed is such that hydrogen gas is introduced and the pressure is adjusted to $1 \times 10^{-3}$ Torr to the order of 1 Torr. The hydrogen gas introduced at this time may be hydrogen 100%, but may also be mixed with inert gas such as argon, neon or helium for the stabilization of discharge. The mold base material is heated by a heater, not shown, in the substrate holder. The optimum substrate temperature differs depending on the conditions under which the mold is used for press-molding and the quality of the glass, but generally is 200°-400° C. By a RF (usually a frequency of 13.56 MHz) being applied to the target and the target holder, the carbon source of the target is sputtered and carbon films are deposited on the mold base material. In this manner, the mold base material is coated with a-C:H film having a film thickness of the order of 0.2-1.5 μm.

Although the RF sputtering method has been described above as the sputtering method, the present invention is not restricted thereto, but use may also be made of the RF magnetron sputtering method, the DC sputtering method or the like. Again in these methods, the conditions of film making such as pressure and substrate temperature may be substantially the same as those in the RF sputtering method.

By the use of the film deposition apparatus shown in FIG. 7, a-C:H film was formed on the mold base material comprising WC(90%) and Co(10%). 10 SCCM of Ar and 10 SCCM of $H_2$ were first introduced, and a valve, not shown, was adjusted to render the pressure to 0.1 Torr. The mold base material was heated to 300° C. by a heater, whereafter a RF power source of 350 W was applied thereto and deposition was started. By approximately one hour of film deposition, a-C:H film having a film thickness of 0.5 μm was formed on the mold base material. The mold thus obtained is referred to as No. 12. When the hydrogen content in this film was measured by combustion analysis, it was 24 atom %.

By the use of the deposition apparatus of FIG. 7 and with the conditions of deposition changed in the following manner, a-C:H film was deposited on the mold base material comprising WC(90%) and Co(10%). 20 SCCM of Ar and 5 SCCM of H$_2$ were first introduced, and a valve, not shown, was adjusted to render the pressure to $1 \times 10^{-2}$ Torr. The mold base material was heated to 350° C. and a RF power of 300 W was applied thereto. By approximately one hour of deposition, a-C:H film of 0.4 μm was formed. The mold thus obtained is referred to as No. 13. When the hydrogen content in this film was measured by combustion analysis, it was 12 atom %.

By the use of each mold coated with the a-C:H film, molding was effected 200 times in the same manner as in Embodiment 1, whereafter the roughness of the surface was measured. The result is shown in Table 8 below.

TABLE 8

| No. | Roughness of surface Rmax (μm) | |
|---|---|---|
| | Lens | Mold |
| 12 | 0.03 | 0.02 |
| 13 | 0.03 | 0.02 |

By the use of each mold coated with the a-C:H film, molding was effected 10,000 times in the same manner as in Embodiment 2, whereafter the roughness of the surface was measured. The result is shown in Table 9 below.

TABLE 9

| No. | Number of molding | Roughness of surface Rmax (μm) | |
|---|---|---|---|
| | | Lens | Mold |
| 12 | 200 | 0.03 | 0.03 |
| | 1000 | 0.03 | 0.03 |
| | 5000 | 0.03 | 0.03 |
| | 10000 | 0.04 | 0.03 |
| 13 | 200 | 0.03 | 0.03 |
| | 1000 | 0.03 | 0.03 |
| | 5000 | 0.03 | 0.03 |
| | 10000 | 0.04 | 0.03 |

Embodiment 5

A method of manufacturing a mold by the plasma ion plating method will hereinafter be described with reference to FIG. 8.

Figure 8:
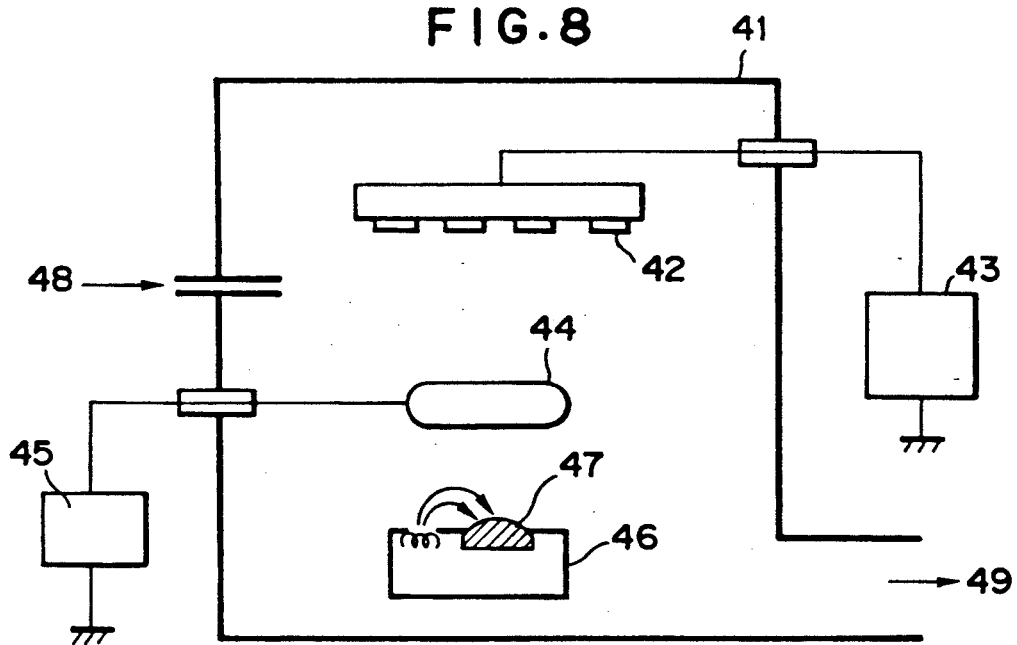

FIG. 8 shows an ion plating apparatus used in the present embodiment. The reference numeral 41 designates a vacuum chamber, the reference numeral 42 denotes a mold base material comprising super-hard alloy and a substrate holder, the reference numeral 43 designates a DC power supply, the reference numeral 44 denotes a RF coil, the reference numeral 45 designates a RF power supply and a matching box, the reference numeral 46 denotes an electron gun, the reference numeral 47 designates a solid carbon source, the reference numeral 48 denotes a gas inlet port, and the reference numeral 49 designates an exhaust port connected to an exhaust system, not shown.

It is to be understood that the atmosphere in which a-C:H film is formed in such that a mixture of hydrogen gas and inert gas is introduced and the pressure is regulated to the order of $1 \times 10^{-5} - 1 \times 10^{-3}$ Torr. With hydrogen gas alone, discharge becomes unstable and therefore, mixing inert gas (such as helium, neon or argon) therewith is desirable. The mold base material is heated by the use of a heater, not shown. The substrate temperature may generally be of the order of 200°–400° C. The carbon source is provided by evaporating solid graphite or the like by the use of an electron gun. At this time, the introduced gases are made into plasma by the use of the RF coil (usually a frequency of 13.56 MHz) and further, a bias 50–1000 V of negative voltage is applied to the mold base material and ions are applied to the mold base material, thereby forming a-C:H film having a film thickness of the order of 0.2–1.5 μm on the mold base material, whereby the mold of the present invention is manufactured.

By the use of the deposition apparatus shown in FIG. 8, a-C:H film was formed on the mold base material comprising WC(90%) and Co(10%). 10 SCCM of Ar gas and 10 SCCM of H$_2$ gas were introduced to render the pressure to $2 \times 10^{-4}$ Torr. The mold base material was heated to 250° C., and a bias of −250 V was applied thereto. Further, a RF of 300 W was applied to the RF coil and graphite was evaporated by the electron gun, whereby a-C:H film of 0.5 μm was formed on the mold base material. The mold thus obtained is referred to as No. 14.

With the conditions of deposition changed in the following manner, a-C:H film was formed on the mold base material comprising WC(90%) and Co(10%). 7 SCCM of Ar gas and 20 SCCM of H$_2$ gas were introduced, the pressure was rendered to $1.5 \times 10^{-4}$ Torr, and the mold base material was heated to 300° C., and a bias of −400 V was applied thereto. Further, a RF power of 250 W was applied to the RF coil, and graphite was evaporated by the electron gun, whereby a-C:H film of 0.5 μm was formed on the mold base material. The molding mold thus obtained is referred to as No. 15.

By the use of each mold coated with the a-C:H film, molding was effected 200 times in the same manner as in Embodiment 1, whereafter the roughness of the surface was measured. The result is shown in Table 10 below.

TABLE 10

| No. | Roughness of surface Rmax (μm) | |
|---|---|---|
| | Lens | Mold |
| 14 | 0.03 | 0.02 |
| 15 | 0.03 | 0.02 |

By the use of each mold coated with the a-C:H film, molding was effected 10,000 times in the same manner as in Embodiment 2, whereafter the roughness of the surface was measured. The result is shown in Table 11 below.

TABLE 11

| No. | Number of molding | Roughness of surface Rmax (μm) | |
|---|---|---|---|
| | | Lens | Mold |
| 14 | 200 | 0.03 | 0.03 |
| | 1000 | 0.03 | 0.03 |
| | 5000 | 0.03 | 0.03 |
| | 10000 | 0.04 | 0.03 |
| 15 | 200 | 0.03 | 0.03 |
| | 1000 | 0.03 | 0.03 |
| | 5000 | 0.03 | 0.03 |
| | 10000 | 0.04 | 0.03 |

Embodiment 6 a-C:H film and hard carbon film were made by the ECR-PCVD apparatus shown in FIG. 6. A magnetic field is applied to the cavity 21 by the electromagnet 22, a microwave is introduced from the microwave introduction window 24 through the waveguide tube 23, and gas is introduced from the gas inlet port 27 into the cavity to thereby exist the gas.

The magnitude of the magnetic field was set so as to be 900 gauss at the microwave introduction port and 400 gauss on the surface of the mold. The mold 26 supported on the mold holder 25 was installed outside the cavity, as shown in FIG. 6. Mixed gases of benzene/hydrogen=1/1 were introduced from the gas introduction port 27 into the ECR-PCVD apparatus, and the microwave power was set to 100 W. The mold holder was set so that it was insulated from the chamber and a bias potential could be applied to the mold.

The other conditions, together with the result, are shown in Table 12 below.

As the substrate, use was made of a substrate obtained by making an SiC film of 100 μm on sintered SiC by the thermal CVD method, and thereafter polishing the surface thereof to the roughness of surface Rmax 0.01 μm. Each sample was made at a deposition rate of 100-1000 Å/min so that the film thickness was 5000 Å.

The spin density was analyzed by the electron spin resonance (ESR) method, and the hardness of the film was measured by a Knoop hardness meter.

The hydrogen content and the density were measured by using rock salt as the substrate, depositing a film under the same conditions as those shown in Table 12 below, and thereafter water-dissolving and removing the rock salt, and isolating the film. The hydrogen content was quantified by the combustion analysis method. Subsequently, the determination of Hydrogen content was effected with respect to the samples by the FT-IR, with the detected analytical line of the combustion analysis result and the peak intensity of FT-IR spectra.

The density was measured by the method using a pycnometer.

The results are shown in Table 12.

one minute, wherewith after the pressure force was released and the glass blank was cooled to 230° C. and parted from the mold.

After such press-molding was carried out 50 times, the mold was removed from the molding apparatus to examine the hardness of the film and the peeling-off state of the film. Here, judgement as to the peeling-off state of the film is such that a case where peeling-off by 0.1 μm or more is not found when examined by a scanning electron microscope (SEM) is judged as there being no peeling-off and a case where peeling-off by 1 μm or more is found when examined by an optical microscope and a case where peeling-off by 0.1 μm or more is found when examined by the SEM are judged as there being peeling-off (this also holds true hereinafter). The result is shown in Table 13 below.

TABLE 13

| No. | Number of molding | Film hardness (kg/mm$^2$) | Peeling-off of film |
|---|---|---|---|
| 16 | 1st time | — | Fusion of glass |
| 17 | 50th time | 700 | None |
| 18 | 50th time | 1600 | None |
| 19 | 50th time | 1800 | None |
| 20 | 12th time | — | Peeling-off (3 μm) |
| 21 | 20th time | less than 100 | Peeling-off (10 μm) Fusion of glass |

As shown above, the molds coated with the a-C:H film and hard carbon film of the present invention did not cause peeling-off of the film and exhibited a good molding property.

Embodiment 7

By the use of the RF sputtering apparatus of FIG. 7, a mold was manufactured by the plasma sputter deposition method in the same manner as in Embodiment 4.

TABLE 12

| Sample No. | Pressure (Torr) | Substrate temp. (°C.) | Substrate bias (V) | Spin density (spin/cm$^3$) | H content (atom %) | Film density (g/cm$^3$) | Film hardness (kg/mm$^2$) | Roughness of surface (Rmax μm) |
|---|---|---|---|---|---|---|---|---|
| 16 | $1 \times 10^{-2}$ | 150 | 0 | $1 \times 10^{17}$ | 60 | 1.3 | 400 | 0.02 |
| 17 | $1 \times 10^{-2}$ | 300 | 0 | $2 \times 10^{17}$ | 40 | 1.5 | 1000 | 0.03 |
| 18 | $1 \times 10^{-4}$ | 150 | −400 | $5 \times 10^{18}$ | 10 | 1.8 | 1600 | 0.01 |
| 19 | $1 \times 10^{-4}$ | 150 | −500 | $5 \times 10^{18}$ | 5 | 1.8 | 1800 | 0.01 |
| 20 | $1 \times 10^{-4}$ | 150 | −1000 | $1 \times 10^{20}$ | 2 | 2.0 | 1800 | 0.01 |
| 21 | $1 \times 10^{-4}$ | 450 | −500 | $2 \times 10^{18}$ | 2 | 1.5 | 800 | 0.06 |

Nos. 16, 20 and 21 show comparative examples.

Subsequently, by the use of the mold of Nos. 16–21, a molding test was carried out by the molding apparatus shown in FIG. 10.

In FIG. 10, the upper mold member 130 and the lower mold member 132 are ones having a-C:H film and hard carbon film, respectively, formed on mold base materials manufactured by the above-described method.

First, low melting point glass of a glass transition point 292° C. and a yield point 319° C. (glass of a softening point of about 342°–370° C. disclosed in Japanese Laid-Open Patent Application No. 63-170241) was roughly worked into a predetermined shape and dimensions, whereby there was obtained a blank for molding.

Subsequently, a molding test was carried out in the same manner as in Embodiment 2.

However, the temperature of the glass blank at a position 120-4 was rendered to 320°–335° C., whereafter the temperatures of the upper mold member 130 and the lower mold member 132 were rendered to 335° C., and the glass blank was pressed a pressure of 100 kg/cm$^2$ for By the use of the deposition apparatus of FIG. 7, the conditions of deposition were set as follows, and a hard carbon film was formed on a mold base material comprising WC(90%) and Co(10%) and having surface roughness Rmax 0.02 μm. First, 10 SCCM of Ar and 10 SCCM of H$_2$ were introduced, and a valve, not shown, was adjusted to render the pressure to $5 \times 10^{-2}$ Torr. The mold base material was heated to 150° C., and an RF power of 300 W was applied thereto. By approximately one hour of deposition, a-C:H film having a film thickness of 5000 Å was formed. The mold thus obtained is referred to as No. 22.

This film hard a hydrogen content of 12 atom %, a density of 1.8 g/cm$^3$, surface roughness Rmax 0.02 μm and a spin density of $5 \times 10^{18}$ spin/cm$^3$.

On the other hand, a mold on which a film was deposited under the same conditions as No. 22 with the exception that the introduced gas was changed to 20 SCCM of Ar gas is referred to as No. 23. The film of this mold contained very little hydrogen and had a density of 2.1 g/cm³, surface roughness Rmax 0.01 μm and a spin density of $5 \times 10^{19}$ spin/cm³.

A molding test was carried out by the use of the molds Nos. 22 and 23 and a molding apparatus similar to that used in Embodiment 6.

By the use of glass of a glass transition point 365° C. and a yield point 397° C. (glass of an American softening point of about 390°–435° C. disclosed in Japanese Laid-Open Patent Application No. 55-154343), molding was effected at a molding temperature of 415° C. and a molding pressure of 100 kg/cm² and for a pressing time of one minute.

The mold of No. 23, after the 21st molding, exhibited much peeling-off of a minute area of several tens to several hundred μm in diameter at the marginal portion of the surface of the mold, and became cloudy at location corresponding to the portions of the molded glass surface in which the film peeled off, and had surface roughness of Rmax 0.1 μm.

No. 22 did not cause such peeling-off of the film, but could be molded up to the 50th time.

As described above, good molding free of peeling-off of the film could be accomplished by using the mold coated with the a-C:H film according to the present invention.

Embodiment 8 (Heating Process for Dehydrogenation)

A hard carbon film was made by the ion beam deposition apparatus shown in FIG. 5.

When a hard carbon film is to be formed, a mold base material 17 having its surface cleaned by an organic solvent and comprising WC(95%) and Co(5%) (surface roughness of Rmax 0.02 μm) is installed on a holder 18, and the air is exhausted from an exhaust port 19 to render the internal pressure of a chamber 11 to $5 \times 10^{-7}$ Torr.

Subsequently, from a gas inlet port 14, a mixture of gases CH₄ and Ar is introduced at a mixture ratio CH₄/Ar=1/1 to render the interior of a chamber 11 to $1 \times 10^{-4}$ Torr. The raw material gases are ionized by the ionization chamber 13 of an ion gun 12, and a voltage of 500 V is applied to an ion beam extractive grid 15 and an ion beam is applied to a draw-out base material 17 to thereby deposite. At this time, the ion beam current was 0.6 mA/cm², and the heating of the substrate was not specially done.

The film thickness was 10000 Å, the roughness of the surface was Rmax 0.01–0.02 μm, the film density was 1.8 g/cm³, and the hardness was 1400–1600 kg/mm².

The heating process was carried out for two hours in an atmosphere in which the partial pressure of oxygen which is an impurity in N₂ has of 1.2 atmospheric pressure was $5 \times 10^{-3}$ Torr or less.

Thereafter, a molding test was carried out by the use of an apparatus similar to that used in Embodiment 6.

By the use of glass of the SF8 flint line (made of OHARA, having a transition point 444° C./ and a yield point 476° C. and containing lead element), press-molding was effected at a molding temperature of 520° C. and a molding pressure of 100 kg/cm² for one minute.

The heat treatment temperature, the quality of film before molding, the state of the mold material after molding and the amount of lead deposited on the surface of the molded glass are shown in Table 14 below. The amount of lead was detected from the peak intensity of lead measured by the X-ray diffraction method.

Glass molded by the mold materials of Nos. 26–31 were usable without being finally polished thereafter.

TABLE 14

| Sample No. | Mold member heat treatment temp. (°C.) | After heating process (before molding) | | | | | After molding | | Pb peak intensity of molded glass surface (cps) |
|---|---|---|---|---|---|---|---|---|---|
| | | Hardness (kg/mm²) | Surface roughness Rmax (μm) | Density (g/cm³) | Spin density (spin/cm³) | H content (atom %) | Peeling-off of film | Hardness (kg/mm²) | |
| 24 | No process | 1600 | 0.01 | 1.8 | $5 \times 10^{18}$ | 13 | ○ | 1400 | 350 |
| 25 | 350 | 1500 | 0.01 | 1.8 | $1 \times 10^{19}$ | 6 | ○ | 1500 | 330 |
| 26 | 400 | 1600 | 0.01 | 1.8 | $2 \times 10^{17}$ | 4 | ○ | 1500 | 180 |
| 27 | 500 | 1400 | 0.02 | 1.9 | $2 \times 10^{17}$ | 1 | ○ | 1400 | 40 |
| 28 | 550 | 1500 | 0.01 | 1.9 | less than $10^{17}$ | 1 | ○ | 1400 | 0 |
| 29 | 600 | 1500 | 0.02 | 1.9 | less than $10^{17}$ | 0 | ○ | 1500 | 0 |
| 30 | 650 | 1300 | 0.02 | 1.9 | less than $10^{17}$ | 0 | ○ | 1200 | 0 |
| 31 | 750 | 800 | 0.05 | 1.8 | less than $10^{17}$ | 0 | △ | 800 | 0 |
| 32 | 850 | less than 500 | 0.08 | 1.7 | less than $10^{17}$ | 0 | X | — | — |

○: no peeling-off of film
△: peeling-off in minute areas
X: generally peeling-off
No. 24 shows a comparative example.

Embodiment 9 (Heat treatment for Dehydrogenation)

By the use of a mold base material similar to that in Embodiment 8, a hard carbon film was made to a film thickness of 12000 Å on the molding surface in a similar manner, whereby a mold member was made. The heat treatment was carried out at 520° C. for one hour in an atmosphere in which the partial pressure of oxygen was controlled and the total pressure was rendered to 1.2 atmospheric pressure by introducing a mixture of {O₂(1%)+Ar(99%)} gas and Ar gas. Glass was press-molded by an apparatus similar to and under conditions similar to Embodiment 8. The partial pressure of oxygen during the heating process and the result of molding are collectively shown in Table 15 below.

The hardness before the heat treatment was 1400–1600 kg/mm². The mark x in the column of the molding property shows that the deterioration of the film hardness and the structural strength during the heating process was keen and fusion of glass and the film and peeling-off of the film occurred and molding could not be accomplished, the mark Δ shows that molding could be accomplished, but the surface accuracy of the molded glass surface was insufficient due to the peeling-off of the film of the mold, and the mark o shows that molding was good.

TABLE 15

| No. | Partial pressure of oxygen during heat treatment (Torr) | Hardness of mold after heat treatment (kg/mm$^2$) | Molding property |
|---|---|---|---|
| 33 | $5 \times 10^{-1}$ | less than 500 | x |
| 34 | $1 \times 10^{-1}$ | 800 | Δ |
| 35 | $1 \times 10^{-2}$ | 1200 | o |
| 36 | $5 \times 10^{-3}$ | 1500 | o |
| 37 | less than $1 \times 10^{-3}$ | 1400 | o |

Figure 12:
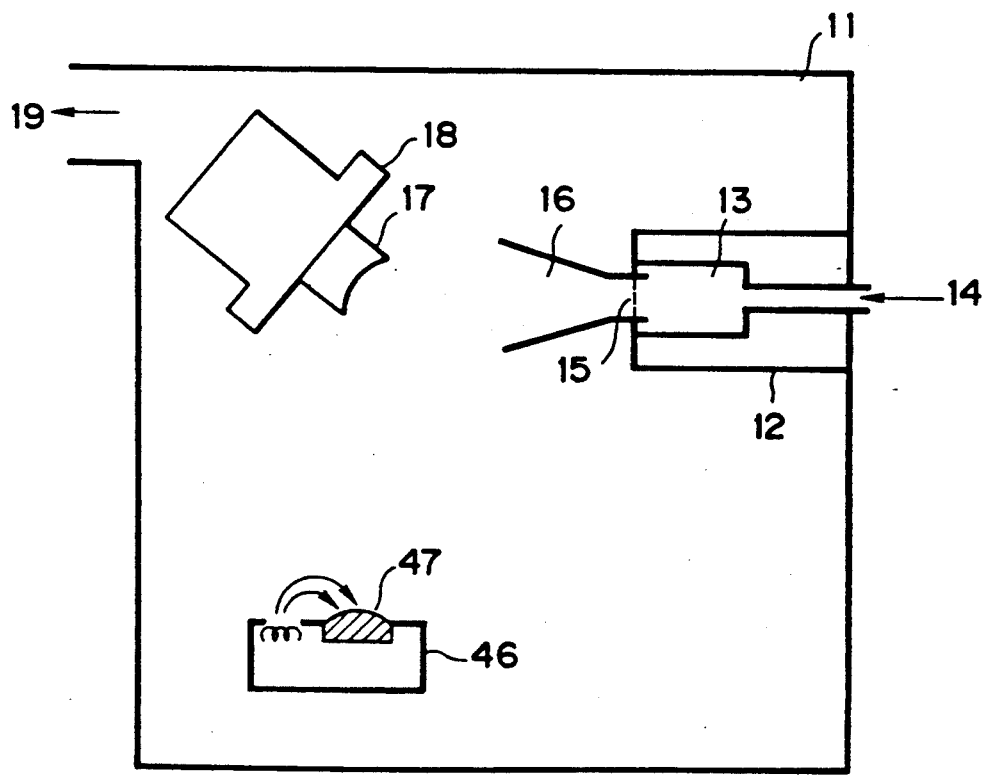

Embodiment 10 (Heat treatment for Dehydrogenation)

a-C:H film and hard carbon film were made by the use of an apparatus shown in FIG. 12.

In FIG. 12, the reference numeral 11 designates a vacuum chamber, the reference numeral 12 denotes an ion gun, the reference numeral 13 designates an ionization chamber, the reference numeral 14 denotes a gas inlet port, the reference numeral 15 designates an ion beam extractive grid, the reference numeral 16 denotes an ion beam, the reference numeral 17 designates a mold base material, the reference numeral 18 denotes a substrate holder and a heater, the reference numeral 19 designates an exhaust hole, the reference numeral 46 denotes an electron gun, and the reference numeral 47 designates a solid carbon source.

Use was made of the mold base material 17 comprising WC(84%)-TiC(8%)-TaC(8%) and having surface roughness of Rmax 0.02 μm, and the surface thereof was cleaned by an organic solvent, whereafter the mold base material was installed on the holder 18, and the air is exhausted from the exhaust port 19 to render the interior of the chamber 11 to $5 \times 10^{-7}$ Torr.

The mold base material was heated to a desired temperature by the use of a heater, not shown.

Subsequently, a mixture of assist gas $H_2$ and Ar gas was introduced from the gas inlet port 14 to render the interior of the chamber 11 to $2 \times 10^{-4}$ Torr. The assist gas was ionized in the ionization chamber 13 of the ion gun 12, and was drawn out into the ion beam extractive grid 15, and a voltage was applied thereto and an ion beam was extracted and applied to the mold base material 17.

On the other hand, the carbon source 47 such as solid graphite or glassy carbon was deposited by the use of the electron gun 46.

A film was deposited a film thickness of 2000 Å while ion beam assist was effected in this manner.

The detailed conditions of deposition, the hydrogen content in the film, the density of the film, the roughness of the surface and the result after the heat treatment are collectively shown in Table 16 below.

The heat treatment was carried out in an Ar gas atmosphere of 1.2 atmospheric pressure (the partial pressure of oxygen $1 \times 10^{-2}$ Torr or less) at 600° C. for two hours.

Any of the films of Nos. 38–43 contained very little hydrogen after the heat treatment, and had a spin density of $1 \times 10^{18}$ spin/cm$^3$ or less.

Subsequently, a molding test was carried out with respect to Nos. 38–41 having sufficient hardness after the heat treatment. The molding apparatus and the molding method were similar to those adopted in Embodiment 8, that is, by the use of SF8 (the flint line produced by OHARA), molding was effected at a molding temperature of 520° C. and a molding pressure of 100 Kg/cm$^2$ for one minute.

As regards Nos. 38–40, even after 50 times of molding, deterioration of the roughness of the surface and the hardness was not found, nor the peeling-off of the film was found even by the SEM.

No. 41 began to present peeling-off of the film by several tens to several hundred μm after the 14th molding, and at the 20th time, deterioration of the roughness of the surface of the molded glass and the surface accuracy thereof was severe and molding was discontinued.

As described above, the mold coated with the a-C:H film according to the present invention and the mold material coated with a hard carbon film provided by heating the a-C:H film after it was made are remarkably improved in durability.

TABLE 16

| Sample No. | Conditions of deposition | | | Before heat treatment | | | After heat treatment | | Hardness (kg/mm$^2$) |
|---|---|---|---|---|---|---|---|---|---|
| | Assist gas mixture ratio H$_2$Ar | Extraction voltage (V) | Substrate temp. (°C.) | H content (atom %) | Film density (g/cm$^3$) | Surface roughness (Rmax μm) | Film density (g/cm$^3$) | Surface roughness (Rmax μm) | |
| 38 | 1/1 | 500 | 150 | 5 | 1.9 | 0.01 | 1.9 | 0.02 | 1600 |
| 39 | H$_2$ only | 300 | 150 | 16 | 1.9 | 0.01 | 1.9 | 0.01 | 1200 |
| 40 | 1/1 | 400 | 300 | 8 | 1.7 | 0.02 | 1.7 | 0.02 | 2000 |
| 41 | Ar only | 300 | 300 | 0 | 2.0 | 0.02 | 1.6 | 0.02 | 1200 |
| 42 | Ar only | 250 | 500 | 0 | 1.5 | 0.04 | 1.1 | 0.08 | 100 |
| 43 | H$_2$ only | 1000 | 150 | 5 | 1.3 | 0.05 | 1.2 | 0.08 | 200 |

Embodiment 11 (Heat treatment for Dehydrogenation)

By the use of a mold base material similar to that used in Embodiment 8, a-C:H film was formed to a film thickness of 5000 Å on the molding surface in a similar manner to thereby make mold members. These mold members were heat-treated at 590° C. for two hours with the pressure reduced to $5 \times 10^{-6}$ Torr, whereby the a-C:H film was changed into a hard carbon film, and this was used as Sample No. 44. What was not heat-treated was used as Sample No. 45. Glass was molded by the same apparatus and under the same conditions as those in Embodiment 8. Molding was effected 50 times on end with the mold members 38 and 39 mounted on the cylinders 138 and 140, and the amount of lead on the surface of each molded glass was detected by the X-ray diffraction method.

The result is shown in Table 17 below.

TABLE 17

| Number of molding | Pb peak intensity of surface of molded glass (cps) | |
|---|---|---|
| | No. 44 subjected to heat treatment | No. 45 not subjected to heat treatment |
| 1 | 0 | 300 |
| 2 | 0 | 280 |
| 4 | 0 | 150 |
| 8 | 0 | 100 |
| 15 | 0 | 40 |
| 25 | 0 | 0 |
| 50 | 0 | 0 |

As shown above, by effecting the heat treatment, good molded glass could be obtained from the first molding even if final polishing was not effected.

Embodiment 12

A carbon film was formed on the surface of a mold base material polished to surface roughness Rmax 0.01 μm similar to that in Embodiment 6, by the apparatus shown in FIG. 6.

The mold base material 26 was installed on the holder 25 and the internal pressure of the apparatus was reduced to $1 \times 10^{-6}$ Torr, whereafter benzene and hydrogen gas were introduced into the apparatus to provide a desired pressure. The mold base material was heated and kept at a desired temperature, whereafter a magnetic field was applied thereto by the electromagnet 22, a bias voltage was applied to the mold base material and a microwave was introduced to thereby deposite films to 10000 Å each. The mold base material No. 46 was subjected to the heat treatment after a carbon film was made thereon. The conditions were: an $N_2$ gas atmosphere of 1.2 atmospheric pressure (the partial pressure of oxygen being $5 \times 10^{-3}$ Torr or less), 600° C. and the heating time of one hour.

The conditions of deposition and the characteristics of the film before molding, together with the result of a molding test, are collectively shown in Table 18 below.

The crystalline property was measured by the X-ray diffraction method.

The molding test was carried out by the same apparatus and under the same conditions and by the use of the same gas as those in Embodiment 8, and molding was effected 50 times on end.

The mark o shows that after molding, peeling off of the film by 10 μm or more was not found by an optical microscope, and the mark x shows that peeling-off of the film by 10 μm or more was found.

As described above, films containing a crystal component therein are remarkable in peeling-off of the film and deterioration of the roughness of the surface and are not preferable.

TABLE 18

| | No. 46 | No. 47 | 48 |
|---|---|---|---|
| Conditions of deposition | | | |
| Intensity of magnetic field at the substrate (Gauss) | 400 | 400 | 875 |
| Benzene/H₂ ratio | 3/1 | 3/1 | 1/9 |
| Pressure (Torr) | $1 \times 10^4$ | $5 \times 10^4$ | 0.5 |
| Temperature of mold base material (°C.) | 300 | 500 | 600 |
| Microwave power (W) | 200 | 200 | 1000 |
| Bias of mold base material (V) | −500 | −250 | +50 |
| Film characteristics | | | |

TABLE 18-continued

| | No. 46 | No. 47 | 48 |
|---|---|---|---|
| before molding | | | |
| Crystalline property (X-ray crystal diffraction) | amorphous | graphite | diamond |
| H content (atom %) | 2 | 2 | 7 |
| Spin density (spin/cm³) | $1 \times 10^{18}$ | $5 \times 10^{18}$ | $1 \times 10^{19}$ |
| Film density (g/cm³) | 1.8 | 1.7 | 2.2 |
| Surface roughness Rmax (μm) | 0.01 | 0.02 | 0.05 |
| After molding | | | |
| Peeling-off of film | O | X | O |
| Surface roughness Rmax (μm) | 0.01 | — | 0.11 |

Embodiment 13

Carbon films as shown in Table 16 were made on respective mold base materials by the same apparatus and under the same conditions as Samples Nos. 38-41 in Embodiment 10.

A molding test was carried out by the same apparatus and under the same conditions and by the use of the same glass as those in Embodiment 6. However, the molding temperature was 335° C., the molding pressure was 100 kg/cm², the pressing time was one minute, and molding was effected 100 times on end.

With regard to the mold of Nos. 38, 39 and 40, peeling-off of the film by 3 μm or more was not found after molding, nor deterioration of hardness was found.

With regard to the glass molded by the mold of No. 41, deterioration of the roughness of the surface and the accuracy of the surface was found after the 62nd molding, and on the surface of the mold after the 100th molding, peeling-off of the film by 3 μm was found much particularly in the marginal portion.

As described above, by coating the mold base material with a-C:H film containing 40 atom % of hydrogen therein and having a film density of 1.5 g/cm³ or more, peeling-off of the film does not occur and the durability of the mold is improved. Also, by using a mold coated with a hard carbon film containing 0-5 atom % of hydrogen therein and having a spin density of $1 \times 10^{18}$ spin/cm³ or less and a film density of 1.5 g/cm³ or more, there can be molded a good optical element which is low in reactiveness to glass and which does not require final polishing.

Further, said hard carbon film which is low in reactivity to glass is heat-treated and manufactured after a hard carbon film containing 5-40 atom % of hydrogen therein is made, whereby peeling-off of the film does not occur and the durability of the mold is improved and a stable film can be provided with good reproducibility by the heat treatment.

By using the mold according to the present invention, there can be obtained molded glass which does not require final polishing.

The film disclosed in Japanese Laid-Open Patent Application No. 61-183134 is a film of unclear classification and characteristic called DLC, whereas the present invention has realized a particular film which is rich in practicability.

In the film disclosed in Japanese Laid-Open Patent Application No. 61-281030, the surface of the formed film is not smooth and requires surface treatment after the making of the film. Further, it contains a crystal component therein and therefore is of inhomogeneous, and the durability is reduced by the roughing of the film.

The film disclosed in Japanese Laid-Open patent Application No. 64-83529 does not contain hydrogen therein during the making of the film and therefore has high internal stress which leads to the readiness with which the film peels off.

2) Description of a Second Invention

Description will now be made of some embodiments of the mold of the aforedescribed second object which is coated with an a-C:H film decreased in the hydrogen content from the interface of the film with the mold base material toward the surface of the film thereof.

Embodiment 14

Figure 13:
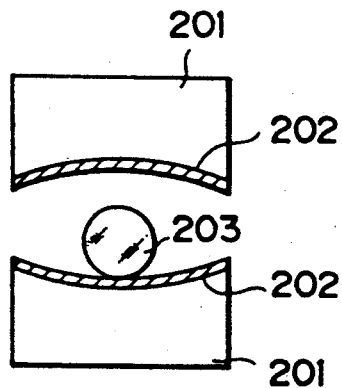
FIGS. 13 to 15 show an embodiment of a molding mold coated with an amorphous carbon film having a decreased hydrogen content which is a second object of the present invention, FIGS. 13 and 14 being cross-sectional views showing an embodiment of the optical element molding mold according to the present invention, FIG. 13 showing the state before press-molding, FIG. 14 showing the state after press-molding, and FIG. 15 being a schematic view showing an radio frequency PCVD (RF-PCVD) apparatus used in a method of manufacturing the optical element molding mold according to the present invention.
Figure 14:
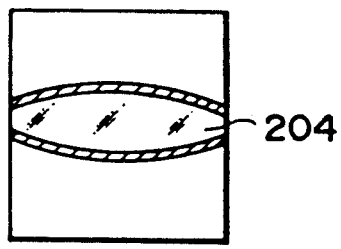

FIGS. 13 and 14 show one form of the mold according to the present embodiment.

FIG. 13 shows the state before the press-molding of an optical element, and FIG. 14 shows the state after the press-molding of the optical element. In FIG. 13, the reference numeral 201 designates a mold base material, the reference numeral 202 denotes a-C:H film formed on the molding surface of the mold base material which is contacted by a glass blank, and the reference numeral 203 designates the glass blank, and in FIG. 14, the reference numeral 204 denotes the optical element. By press-molding the glass blank 203 placed between the molds as shown in FIG. 13, the optical element 204 such as a lens is molded as shown in FIG. 14.

Figure 15:
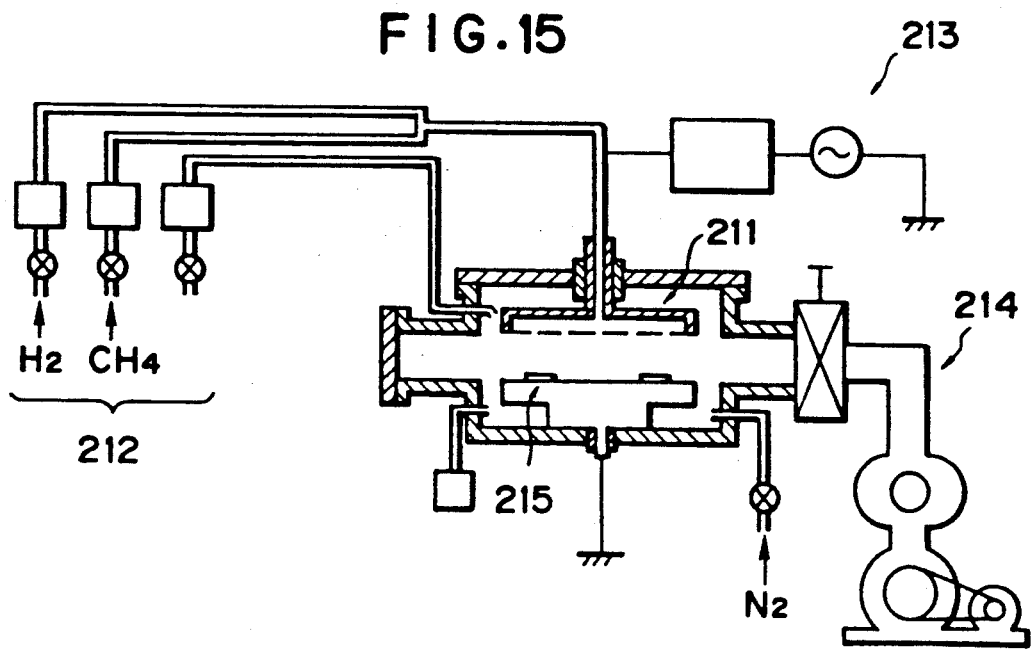

As a method of coating the mold base material 201 with the a-C:H film of the present invention as described above, use was made of the PCVD method. In FIG. 15, there is shown a plainner type RF-PCVD type (hereinafter abbreviated as RF-PCVD) apparatus used for the formation of the film. In FIG. 15, the reference numeral 211 designates a vacuum chamber the reference numeral 212 denotes a gas supply system, the reference numeral 213 designates a RF power supply, the reference numeral 214 denotes an exhaust system, and the reference numeral 215 designates a mold base material.

First, the mold base material 215 was worked into a predetermined shape, and the lens molding surface thereof was polished into a mirror surface. Subsequently, by the RF-PCVD apparatus, $CH_4$ is supplied through the gas supply system 212 at a flow rate of 10 SCCM and at a gas pressure of 0.2 Torr, and 50 W was applied by the RF power of 13.56 MHz, and at room temperature, a film was deposited to a film thickness of 1000 Å on the mold base material (substrate), whereafter film deposition was effected while the substrate temperature was gradually increased. The final substrate temperature was 400° C., and the final film thickness was 5000 Å. The film (thickness 1000 Å) on the surface of contact with the mold base material was chemically analyzed with a result that the hydrogen content was about 50 atom % and the hardness of the film was 800 kg/mm$^2$ in terms of Knoop hardness. On the other hand, the film on the surface of contact with glass was chemically analyzed with a result that the hydrogen content was about 20 atom %, the hardness of the film was 2000 kg/mm$^2$ in terms of Knoop hardness, the roughness of the surface was Rmax 0.02 μm or less and the coefficient of friction was 0.2 or less and thus, the film obtained was a smooth film of high hardness.

Also, when analysis of said film in the direction of depth thereof was effected by an ion microanalyzer, it was confirmed that the hydrogen content was decreased from the surface of contact with the mold base material toward the surface.

Subsequently, the press-molding test of the optical element was carried out by the use of the above-described press-molding mold and other molds and by the use of the aforedescribed apparatus of FIG. 9.

Next, a glass blank provided by adjusting optical glass of the flint line (SF14) to a predetermined amount and making it into a spherical shape is placed in the cavity of the mold, and this is installed in the apparatus shown in FIG. 9.

After the mold in which the glass blank is placed is installed in the apparatus, the lid 52 of a vacuum chamber 51 is closed, and water flows into a water cooling pipe 70 and an electric current is supplied to heaters 58. At this time, valve for 6 and vent valves 68 nitrogen are closed and exhaust system valves 62, 63 and 64 are also closed. An oil rotating pump 61 is rotating at all times.

The valve 62 is opened to begin exhaust, and when the pressure becomes $10^{-2}$ Torr or less, the valve 62 is closed and the valve 66 is opened to thereby introduce nitrogen gas from a cylinder into the vacuum chamber. When a predetermined temperature is reached, an air cylinder 60 is operated to press the glass blank with a pressure of 10 kg/cm$^2$ for five minutes. After the pressure is released, the glass blank is cooled to the transition point or below at a cooling speed of −5° C./min, whereafter it is cooled at a cooling speed of −20° C./min or higher, and when the temperature of the glass blank lowers to 200° C. or below, the valve 66 is closed and the vent valve 63 is opened to thereby introduce air into the vacuum chamber 51. The lid 52 is then opened and the upper mold keeper is removed, and then the molded article is taken out.

In the manner described above, a lens 204 shown in FIG. 14 was formed by the use of the optical glass SF14 of the flint line (the softening point Sp=586° C. and the transition point Tg=485° C.). The then conditions of deposition, i.e., the time-temperature relation, in the same temperature graph as the graph shown in FIG. 11.

Subsequently, the roughness of the surface of the molded lens and the roughness of the surface of the mold before and after molding were measured. The result is shown in Table 19 below.

Also, after with respect to Nos. 49, 52 and 53 which did not cause fusion, molding was effected 200 times by the use of the same mold, the roughness of the surface was measured. The result is shown in Table 20 below.

TABLE 19

| Sample No. | Coating | Base material | Roughness of surface Rmax (μm) | | | Parting Property |
| | | | Lens | Mold (before molding) | Mold (after molding) | |
| --- | --- | --- | --- | --- | --- | --- |
| 49 | None | WC(90%) + Co(10%) | 0.04 | 0.02 | 0.03 | Good |
| 50 | None | SiC | — | 0.04 | — | Fused |
| 51 | SiC | WC(90%) + Co(10%) | — | 0.02 | — | Fused |
| 52 | a-C:H | WC(90%) + Co(10%) | 0.03 | 0.02 | 0.02 | Good |

TABLE 19-continued

| Sample No. | Coating | Base material | Roughness of surface Rmax (μm) | | | Parting Property |
|---|---|---|---|---|---|---|
| | | | Lens | Mold (before molding) | Mold (after molding) | |
| 53 | a-C:H | SiC | 0.05 | 0.04 | 0.04 | Good |

TABLE 20

| No. | Roughness of surface Rmax (μm) | |
|---|---|---|
| | Lens | Mold (after 200 times) |
| 49 | 0.14 | 0.15 |
| 52 | 0.03 | 0.02 |
| 53 | 0.05 | 0.04 |

As is apparent from Tables 19 and 20, the mold having the a-C:H film of the present invention formed on the surface thereof could press-mold optical elements of high accuracy which were good in the quality of image formation.

From the foregoing, it is seen that the a-C:H film is excellent in working accuracy and heat resisting property and is fit to every material of every press-molding mold which is good in the adhesion/adherence with respect to the a-C:H film.

Embodiment 15

Use was made of the RF-PCVD apparatus used in Embodiment 14, the mold base material (substrate) was provided on the RF electrode side, the degree of vacuum was 0.03 Torr, and the substrate temperature was room temperature and the flow rate of $CH_4$ was 15 SCCM, and first, the RF power was 50 W and a film was formed to a film thickness of 1000 Å. This film had Knoop hardness 800 kg/mm$^2$ and contained 60 atom % of hydrogen therein. Thereafter, the RF power was changed to 100 W, and a film was made to a film thickness of 4000 Å. This film had Knoop hardness 2200 kg/mm$^2$ and contained about 10 atom % of hydrogen therein, and the roughness of the surface thereof was Rmax 0.03 μm or less and the coefficient of friction thereof was 0.2 or less. By the use of the mold on which this a-C:H film was formed, a press-molding test was carried out by the apparatus shown in FIG. 10.

Optical glass of the flint line (SF14, the softening point Sp=586° C. and the glass transition point Tg=485° C.) was roughly worked into a predetermined shape and dimensions, whereby there was obtained a blank for molding.

The glass blank was placed on the pallet 120, and then was placed in the position 120-1 in the taking-in replacement chamber 104, and the pallet in this position was pushed in the direction of arrow A by the rod 122 of the cylinder 124 and was conveyed to the position 120-2 in the molding chamber 106 beyond the gate valve 112, whereafter in the same manner, pallets were newly successively placed into the taking-in replacement chamber 104 at predetermined timing, and each time, the pallets were successively conveyed to positions 120-2→ ... →120-8 in the molding chamber 106. In the meantime, in the heating zone 106-1, the glass blank was gradually heated by the heaters 128 and was rendered to the softening point or about at the position 120-4, whereafter it was conveyed to the press zone 106-2, where the cylinders 138 and 140 were operated to press the glass blank with a pressure of 10 kg/cm$^2$ for five minutes by the upper mold member 130 and the lower mold member 132, whereafter the pressure was released and the glass blank was cooled to the glass transition point or below, and thereafter the cylinders 138 and 140 were operated to part the upper mold member 130 and the lower mold member 132 from the molded glass article. During this press, said pallet was utilized as a side mold member for molding. Thereafter, the molded glass article was gradually cooled in the gradually cooling zone 106-3. The molding chamber 106 was dilled with inert gas.

The pallet which arrived at the position 120-8 in the molding chamber 106 was then conveyed to the position 120-9 in the evaporation chamber 108 beyond the gate valve 114. Usually, vacuum evaporation is effected here, but in the present embodiment, such evaporation was not effected. In the next cycle of conveyance, the pallet was conveyed to the position 120-10 in the taking-out replacement chamber 110 beyond the gate valve 116. During the next cycle of conveyance, the cylinder 150 was operated and the molded glass article was taken out of the molding apparatus 102 by the rod 148.

The roughness of the molding surfaces of the mold members 130 and 132 before and after the press-molding as described above, the roughness of the optical surface of the molded optical element and the parting property of the molded optical element with respect to the mold members 130 and 132 are shown in Table 21 below.

TABLE 21

| Sample No. | Coating | Base material | Roughness of surface Rmax (μm) | | | Parting Property |
|---|---|---|---|---|---|---|
| | | | Lens | Mold (before molding) | Mold (after molding) | |
| 54 | None | WC(90%) + Co(10%) | 0.04 | 0.02 | 0.03 | Good |
| 55 | None | SiC | — | 0.04 | — | Fused |
| 56 | SiC | WC(90%) + Co(10%) | — | 0.02 | — | Fused |
| 57 | a-C:H | WC(90%) + Co(10%) | 0.03 | 0.03 | 0.03 | Good |
| 58 | a-C:H | SiC | 0.05 | 0.04 | 0.04 | Good |

Subsequently, with respect to Nos. 54, 57 and 58 which did not cause fusion, press-molding was effected 10,000 times on end by the use of the same mold members. The roughness of the molding surfaces of the mold members in this case and the roughness of the optical surface of the molded optical element are shown in Table 22 below.

TABLE 22

| No. | Number of molding | Roughness of surface Rmax (μm) | |
|---|---|---|---|
| | | Lens | Mold |
| 54 | 200 | 0.14 | 0.15 |
| | 1000 | 0.20 | 0.21 |
| | 5000 | 0.23 | 0.24 |
| | 10000 | 0.26 | 0.27 |

TABLE 22-continued

| No. | Number of molding | Roughness of surface Rmax (μm) Lens | Mold |
|---|---|---|---|
| 57 | 200 | 0.03 | 0.03 |
|  | 1000 | 0.03 | 0.03 |
|  | 5000 | 0.03 | 0.03 |
|  | 10000 | 0.04 | 0.03 |
| 58 | 200 | 0.05 | 0.04 |
|  | 1000 | 0.05 | 0.04 |
|  | 5000 | 0.05 | 0.04 |
|  | 10000 | 0.05 | 0.05 |

As shown above, in the present embodiment, even the repetitive use of the mold for press-molding could maintain good surface accuracy sufficiently and optical elements of good surface accuracy could be formed without causing fusion.

Embodiment 16

By a method similar to Embodiment 15, a film was first formed to a film thickness 1000 Å at RF power 50 W. The RF power was then changed to 80 W and the mold base material (substrate) was heated to 300° C., whereafter the film was further formed to 6000 Å. This film had Knoop hardness of 2400 kg/mm$^2$, contained 20 atom % of hydrogen therein, and had surface roughness of Rmax 0.02 μm or less and a coefficient of friction of 0.2 or less. Also, by the analysis in the direction of depth by an ion microanalyzer, it was confirmed that the hydrogen content in the film on that side contacting with the mold base material was 60 atom %, that hydrogen content in the film on the surface side was 20 atom % and that two layers of films were formed by the difference in the hydrogen content. By the use of this mold, a molding test and evaluation similar to those in Embodiment 1 were effected with a result that a mold equal to that of Embodiment 14 was obtained.

a-C:H film in which the hydrogen content exceeds 40 atom % is softer than a film in which the amount of hydrogen content is 5-40 atom % and therefore, when a film containing 5-40 atom % of hydrogen therein is formed on the a-C:H film, the film thickness thereof exceeds 5000 Å and even if the internal stress therein becomes great, the stress can be absorbed in this soft a-C:H film to reduce the stress of the entire film, whereby the adhesion/adherence thereof with respect to the mold base material is improved. Also, not only the stress but also the distortion in the film due to the difference in the coefficient of thermal expansion and to the mechanical deformation resulting from molding can be alleviated.

The optical element molding mold of the present invention is excellent in the parting property with respect to glass and permits mirror surface polishing, and suffers very little from the deterioration of the surface as compared with the prior-art mold even if the mold is used repetitively.

According to the present invention, a-C:H film which is great in the hydrogen content and low in hardness is formed on the molding surface of a mold base material, and by gradually decreasing the amount of hydrogen content, there can be obtain a molding mold which does not react to lead and alkali elements contained in glass in the high temperature state of the glass.

Particularly, by the film containing much hydrogen being provided near the base material, the stress in the film can be alleviated and the adhesion/adherence between the base material and the amorphous film can be improved.

3) Description of a Third Invention

Description will now be made in detail of some embodiments of a molding mold coated with an a-C:H film containing hydrogen atoms and other elements therein which is the third object of the present invention.

Embodiment 17

The surface of a mold base material comprising WC(90%) and Co(10%) was coated with a-C:H film by the ECR-PCVD method (the ECR method). The ECR-PCVD plasma apparatus is of the cavity type shown in FIG. 6, that is, a magnetic field is applied to the cavity 21 by the electromagnet 22, a microwave is introduced from the microwave introduction window 24 through the waveguide tube 23, gas is introduced from the gas inlet port 27 into the cavity and the gas is excited. The magnitude of the magnetic field was set so as to be 2000 gauss in the microwave introduction port and 500 gauss on the surface of the mold. The mold 26 supported on the mold holder 25 was installed outside the cavity resonator as shown in FIG. 6.

TABLE 23

| Mold No. | CH$_4$ | CO | H$_2$ | NH$_3$ | N$_2$ |
|---|---|---|---|---|---|
| 59 | 10 |  | 20 | 1 |  |
| 60 | 10 |  | 20 |  | 1 |
| 61 | 10 |  |  | 1 |  |
| 62 | 20 |  | 20 | 1 |  |
| 63 | 15 |  |  |  | 1 |
| 64 |  | 10 | 10 |  |  |
| 65 |  | 10 | 20 |  |  |
| 66 |  | 5 | 5 |  |  |
| 67 | 10 | 1 | 5 |  |  |
| 68 | 10 | 10 |  | 1 |  |
| 69 | 10 | 10 | 10 |  | 1 |
| 70 | 5 | 5 | 10 | 2 |  |
| 71 | 10 |  | 10 |  |  |

Subsequently, the gases shown in Table 23 above were introduced from the gas inlet port 27, the pressure was rendered to $5 \times 10^{-2}$ Torr, and under constant conditions of microwave power 600 W and the mold surface temperature 300° C., film making was effected for one hour, whereby molds Nos. 59-71 were obtained.

Each film formed was element-analyzed by the combustion method, and the Knoop hardness thereof was measured. The result is shown in Table 24 below.

TABLE 24

| Mold No. | Element analysis value | | | | Knoop hardness (kg/mm$^2$) |
|---|---|---|---|---|---|
|  | C | H | N | O |  |
| 59 | 1.5 | 1 | 1,000 | — | 1800 |
| 60 | 1.5 | 1 | 200 | — | 1750 |
| 61 | 19 | 1 | 20,000 | — | 2100 |
| 62 | 5 | 3 | 100 | — | 1500 |
| 63 | 19 | 1 | 300 | — | 2000 |
| 64 | 4 | 3 | — | 1,000 | 2000 |
| 65 | 1.5 | 1 | — | 30,000 | 1650 |
| 66 | 2 | 1 | — | 500 | 1850 |
| 67 | 2 | 1 | — | 100 | 1900 |
| 68 | 2 | 1.3 | 100 | 200 | 2000 |
| 69 | 1.5 | 1 | 100 | 3,000 | 1950 |
| 70 | 1.5 | 1 | 2,000 | 100 | 1750 |
| 71 | 1.5 | 1 | — | — | 700 |

(The contents of C and H are in atom ratio, and the amounts of N and O are in atom ppm.)

Description will now be made of an example in which by the use of molds coated with these thirteen kinds of films, press-molding of glass lenses was effected by the apparatus shown in FIG. 9.

Optical glass of the flint line (SF14) is first adjusted to a predetermined amount, a glass blank made into a spherical shape is placed in the cavity of a mold, and this is installed in the apparatus.

The mold in which the glass blank is placed is installed in the apparatus, and then the lid 52 of the vacuum chamber 51 is closed, and water flows into the water cooling pipe 70 and a current is supplied to the heaters 58. At this time, the valve 66 for nitrogen gas and rent valve 68 are closed and the exhaust system valves 62, 63 and 64 are also closed. The rotary oil pump 61 is rotating at all times.

The valve 62 is opened to begin exhaust, and when the pressure becomes $10^{-2}$ Torr or less, the valve 62 is closed, and the valve 66 is opened to introduce nitrogen gas from a cylinder into the vacuum chamber. When a predetermined temperature is reached, the air cylinder 60 is operated to press the glass blank with a pressure of 10 kg/cm$^2$ for five minutes. After the pressure is released, cooling is effected at a cooling speed of $-5°$ C./min until the transition point or below is reached, whereafter cooling is effected at a speed of $-20°$ C./min or higher, and when the temperature falls to 200° C. or below, the valve 66 is closed and the leak valve 63 is opened to introduce air into the vacuum chamber 51. The lid 52 is then opened and the upper mold keeper is removed, whereafter the molded article is taken out.

In the manner described above, a lens 4 was molded by the use of optical glass SF14 of the flint line (the softening point Sp=586° C. and the transition point Tg=485° C.). The condition of deposition at this time, i.e., the time-temperature relation, is the same as that shown in FIG. 11.

Subsequently, after molding was effected 200 times by the use of the same mold, the roughness of the surfaces of the molded lenses and the roughness of the surface of the mold before and after molding were measured. The result is shown in Table 25 below.

TABLE 25

| Mold | Roughness of surface Rmax (μm) | | |
|---|---|---|---|
| No. | Lens | Mold (before molding) | Mold (after molding) |
| 59 | 0.03 | 0.03 | 0.03 |
| 60 | 0.03 | 0.03 | 0.03 |
| 61 | 0.03 | 0.03 | 0.03 |
| 62 | 0.03 | 0.03 | 0.03 |
| 63 | 0.03 | 0.03 | 0.03 |
| 64 | 0.03 | 0.03 | 0.03 |
| 65 | 0.03 | 0.03 | 0.03 |
| 66 | 0.03 | 0.03 | 0.03 |
| 67 | 0.03 | 0.03 | 0.03 |
| 68 | 0.03 | 0.03 | 0.03 |
| 69 | 0.03 | 0.03 | 0.03 |
| 70 | 0.03 | 0.03 | 0.03 |
| 71 | 0.10 | 0.05 | 0.07 |

Description will now be made in detail of an example in which by the use of the molds Nos. 59–71, press-molding of glass lenses was effected by the molding apparatus shown in FIG. 10.

Optical glass of the flint line (SF14, the softening point Sp=586° C. and the glass transition point Tg=485° C.) was roughly worked into a predetermined shape and dimensions, whereby a blank for molding was obtained.

The glass blank was placed on the pallet 120 and placed in the position 120-1 in the taking-in replacement chamber 104, and the pallet in this position was pushed in the direction of arrow A by the rod 122 of the cylinder 124 and conveyed to the position 120-2 in the molding chamber 106 beyond the gate valve 112, whereafter in the same manner, pallets were newly successively placed into the taking-in replacement chamber 104 at predetermined timing, and each time, the pallets were successively conveyed to the positions 120-2→ . . . →120-8 in the molding chamber 106. In the meantime, in the heating zone 106-1, the glass blank was gradually heated by the heaters 128 and rendered to the softening point or above at the position 120-4, whereafter it was conveyed to the press zone 106-2, where the cylinders 138 and 140 were operated to press the glass blank with a pressure of 10 kg/cm$^2$ for five minutes by the upper mold member 130 and the lower mold member 132, whereafter the pressure was released and the glass blank was cooled to the glass transition point or below, whereafter the cylinders 138 and 140 were operated to part the upper mold member 130 and the lower mold member 132 from the molded glass article. During this pressing, said pallet was utilized as a side mold member for molding. Thereafter, in the gradually cooling zone 106-3, the molded glass article was gradually cooled. The molding chamber 106 was filled with inert gas.

The pallet which arrived at the position 120-8 in the molding chamber 106 was then conveyed to the position 120-9 in the evaporation chamber 108 beyond the gate valve 114. Usually, vacuum evaporation is effected here, but in the present embodiment, such evaporation was not effected. In the next cycle of conveyance, the pallet was conveyed to the position 120-10 in the taking-out replacement chamber 110 beyond the gate valve 116. During the next cycle of conveyance, the cylinder 150 was operated and the molded glass article was taken out of the molding apparatus 102 by the rod 148.

When 1,000, 5,000 and 10,000 durability tests were carried out, the mold No. 71 coated with a film which does not contain nitrogen and oxygen atoms therein had its coating film peeled off at the 800th–900th time. However, the other molds Nos. 59–70 exhibited lens surface roughness of Rmax 0.3 μm or less even after the 10,000th molding. The best was the mold No. 69 which exhibited Rmax 0.02 μm, and the worst was the mold No. 62 which exhibited Rmax 0.03 μm.

Embodiment 18

In the same manner as in Embodiment 17, by the use of the apparatus shown in FIG. 6 and by the ECR-PCVD method, the surface of a mold base material comprising WC 90% and Co 10% was coated with a-C:H film. However, the microwave power 600 W as changed to 700 W, and the magnitude 2000 gauss of the magnetic filed in the microwave introduction port was changed to 2500 gauss. The kinds and flow rates of gases used for deposition are shown in Table 26 below.

TABLE 26

| Mold No. | CH$_4$ | CH$_3$OH | He | Ne | Ar | Xe | Kr | NH$_3$ | CO | H$_2$ |
|---|---|---|---|---|---|---|---|---|---|---|
| 72 | 10 | | 2 | | | | | | | |
| 73 | 10 | | | 2 | | | | | | 5 |
| 74 | 10 | | | | 2 | | | | | |
| 75 | 10 | | | | | 2 | | | | |
| 76 | 10 | | | | | | 2 | | | |
| 77 | | 10 | 2 | | | | | 1 | | 5 |
| 78 | | | 2 | | | | | | 10 | 5 |

TABLE 26-continued

| Mold No. | CH₄ | CH₃OH | He | Ne | Ar | Xe | Kr | NH₃ | CO | H₂ |
|---|---|---|---|---|---|---|---|---|---|---|
| 79 | | | | | 2 | | | | 1 | 10 |

(Unit: SCCM)

The a-C:H film thus obtained was elementary analyzed by the combustion analysis and the atomic absorption analysis, and the Knoop hardness thereof was measured. The result is shown in Table 27 below.

TABLE 27

| Mold No. | C | H | N | O | He | Ne | Ar | Xe | Kr | Hardness (kg/mm²) |
|---|---|---|---|---|---|---|---|---|---|---|
| 72 | 2 | 1 | | | 500 | | | | | 1,500 |
| 73 | 1.5 | 1 | | | | 900 | | | | 1,200 |
| 74 | 3 | 1 | | | | | 4,000 | | | 2,500 |
| 75 | 1.5 | 1 | | | | | | 100 | | 1,300 |
| 76 | 1.5 | 1 | | | | | | | 100 | 1,400 |
| 77 | 2 | 1 | 10,000 | | 500 | | | | | 1,700 |
| 78 | 3 | 1 | | 1,000 | 3,000 | | | | | 2,600 |
| 79 | 2 | 1 | 1,000 | 1,000 | | | 1,000 | | | 1,800 |

(The contents of C and H are in atom ratio, and the others are in atom ppm.)

Figure 16:
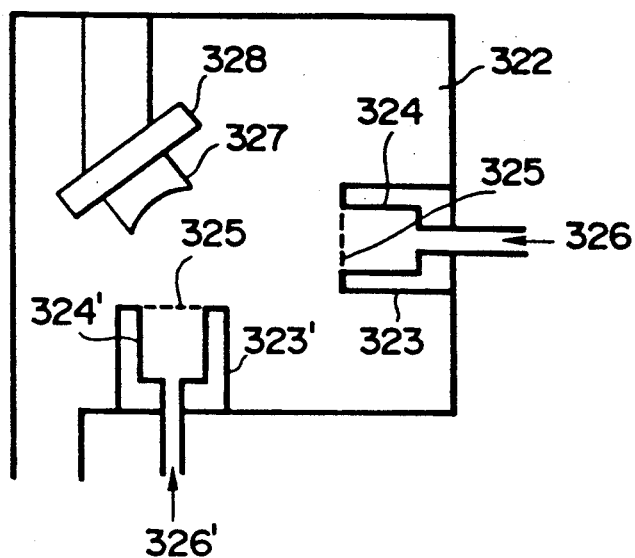
FIGS. 16 and 17 illustrate an embodiment coated with an a-C:H film containing other elements besides hydrogen atoms which is a third object of the present invention.

Subsequently, by the ion beam deposition method shown in FIG. 16, the mold was coated with a film in the same manner as in the above-described example. In FIG. 16, the reference numeral 322 designates a vacuum chamber, the reference numerals 323 and 323' denote two ion gun, the reference numerals 324 and 324' designate ionization chambers, the reference numerals 325 and 325' denote ion beam extractive grids, the reference numerals 326 and 326' designate gas introduction pots, the reference numeral 327 denotes a mold base material, and the reference numeral 328 designates a mold holder.

From the gas inlet port 326, a mixture of carbon-containing gas and hydrogen is introduced and ionized to create an ion beam, and in the gas inlet port 326', inert gas atoms are ionized and drawn out as an ion beam, and a film is formed on the mold base material 327.

The back pressure of the vacuum chamber was $2 \times 10^{-5}$ Torr, methane, hydrogen and helium were used as the film-making gases, and the gas flow rates thereof were fixed to 5 SCCM. At this time, the pressure became $3 \times 10^{-4}$ Torr.

The acceleration voltages of the ion beam of methane and hydrogen and the ion beam of helium were rendered such as shown in Table 28 below and a film was made without the substrate being specially heated. The substrate temperatures were as shown in Table 28 depending on the conditions of each ion beam.

TABLE 28

| | Acceleration voltage | | |
|---|---|---|---|
| Mold No. | Ion beam of methane and hydrogen (kv) | Ion beam of helium (kv) | Substrate temperature (°C.) |
| 80 | 0.5 | 0.5 | 80 |
| 81 | 0.8 | 0.5 | 100 |
| 82 | 1.0 | 0.5 | 120 |
| 83 | 5.0 | 0.5 | 150 |
| 84 | 0.5 | 2 | 100 |
| 85 | 0.8 | 2 | 130 |
| 86 | 1.0 | 2 | 150 |
| 87 | 5.0 | 2 | 180 |

The component analysis and hardness of these films are shown in Table 29 below.

TABLE 29

| Mold No. | C | H | He | Hardness (kg/mm²) |
|---|---|---|---|---|
| 80 | 1 | 1 | 1,000 | 1500 |
| 81 | 1 | 1 | 1,000 | 1400 |
| 82 | 1 | 0.8 | 1,000 | 1800 |
| 83 | 1 | 0.7 | 1,000 | 1850 |
| 84 | 1 | 0.6 | 1,000 | 1900 |
| 85 | 1 | 0.6 | 1,000 | 2000 |
| 86 | 1 | 0.4 | 1,000 | 2300 |
| 87 | 1 | 0.2 | 1,000 | 2900 |

(The contents of C and H are in atom ratio, and the amount of He is in atom ppm.)

Also, slight amounts of N and O were detected in these films.

Subsequently, by the use of molds coated with these sixteen kinds of films and by the apparatus shown in FIG. 9, press-molding of glass lenses was effected.

The roughness of the surfaces of the molded lenses and the roughness of the surface of the molds before and after molding were measured. The result is shown in Table 30 below.

TABLE 30

| | Roughness of surface Rmax (μm) | | | |
|---|---|---|---|---|
| Mold No. | Lens | Mold (before molding) | Mold (after molding) | Parting property |
| 72 | 0.03 | 0.03 | 0.03 | Good |
| 73 | 0.03 | 0.03 | 0.03 | " |
| 74 | 0.03 | 0.03 | 0.03 | " |
| 75 | 0.03 | 0.03 | 0.03 | " |
| 76 | 0.03 | 0.03 | 0.03 | " |
| 77 | 0.03 | 0.03 | 0.03 | " |
| 78 | 0.03 | 0.03 | 0.03 | " |
| 79 | 0.03 | 0.03 | 0.03 | " |
| 80 | 0.03 | 0.03 | 0.03 | " |
| 81 | 0.03 | 0.03 | 0.03 | " |
| 82 | 0.03 | 0.03 | 0.03 | " |
| 83 | 0.03 | 0.03 | 0.03 | " |
| 84 | 0.03 | 0.03 | 0.03 | " |
| 85 | 0.03 | 0.03 | 0.03 | " |
| 86 | 0.03 | 0.03 | 0.03 | " |
| 87 | 0.03 | 0.03 | 0.03 | " |

Subsequently, 1,000, 5,000 and 10,000 durability tests were carried out by the apparatus shown in FIG. 10. In all cases, the roughness of the surfaces of the lenses was Rmax 0.03 μm or less. The best was the film of No. 87 which exhibited Rmax 0.02 μm.

Embodiment 19

Figure 17:
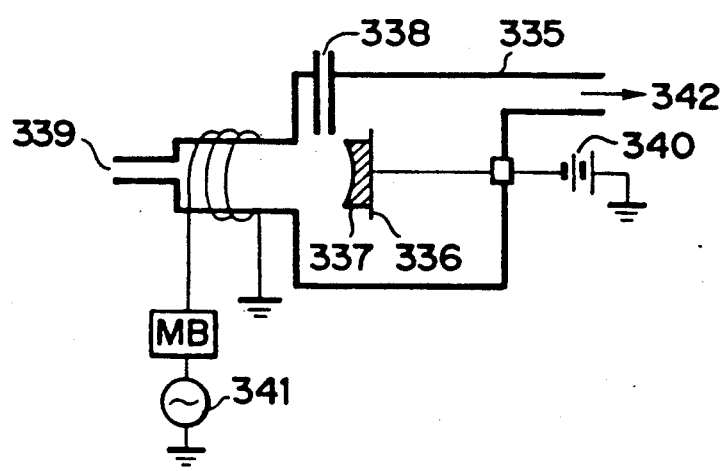

The mold base material was coated with a-C:H film by the use of an apparatus shown in FIG. 17. In FIG. 17, the reference numeral 341 designates RF of 13.56 MHz, and this apparatus is a PCVD apparatus in which a substrate bias can be applied by a DC power supply 340.

When a-C:H film is to be formed, the mold base material 337 having its surface cleaned by an organic solvent is installed on a holder 336, and the air is exhausted from an exhaust port 342 to thereby render the interior of a chamber 335 vacuum. The mold base material 337 is heated to 300° C., and source gas $CH_4+CF_4$ is introduced at the ratio of $CH_4/CH_4=2$ from a gas inlet port 338. $H_2$ gas is introduced by 10 SCCM from an introduction port 339.

RF power 300 W and substrate bias −300 V were applied, the pressure was kept at $2\times10^{-2}$ Torr and discharge was effected. The substrate temperature was held at 150° C. and a film of 0.5 μm was deposited. 30 atom % of hydrogen was contained in the thus produced film a-C:H:F and C-F bonding was confirmed by the surface analysis using ESCA.

Embodiment 20

In the same manner as in Embodiment 19, by the use of the apparatus of FIG. 7, mixture gas of $Ar/H_2=1$ was introduced from the inlet port 339, $CH_4$ gas was introduced from the inlet port 338, RF power 300 W and substrate bias −500 V were applied and a film of 0.5 μm was deposited at a substrate temperature 200° C. Thereafter, $CF_4$ gas was introduced from the introduction port 339 and discharge was effected at RF power 200 W and substrate bias 0 V.

The thus produced film contained 25 atom % of hydrogen therein and C-F bonding was confirmed by ESCA.

The process of making a lens will now be described.

First, a mold base material is worked into a predetermined shape, and the lens molding surface thereof is polished into a mirror surface. A coating of SiC is then formed by the ion plating method. Also, samples Nos. 91 and 92 were coated with a-C:H film by the method of Embodiment 19, and sample No. 93 was coated with a-C:H film by the method of Embodiment 20. The thickness of each film was 0.1 μm. Optical glass of the flint line (SF14) is then adjusted to a predetermined amount, and a glass blank made into a spherical shape is placed in the cavity of the mold, and this is installed in the apparatus.

Description will now be made in detail of an example in which press-molding of a glass lens was effected by the mold according to the present invention. Table 31 below shows the kinds of the mold materials used in the experiment.

TABLE 31

| No. | Coating material | Base material |
|---|---|---|
| 88 | None | WC (90%) + Co (10%) |
| 89 | None | SiC |
| 90 | SiC | WC (90%) + Co (10%) |
| 91 | a-C:H:F | WC (90%) + Co (10%) |
| 92 | a-C:H:F | SiC |
| 93 | a-C:H:F | WC (90%) + Co (10%) |

Nos. 88–90 are comparative materials, and Nos. 91–93 are materials proposed by the present invention. Super-hard alloy WC (90%)+Co (10%) and sintered SiC were used as the base material. By the use of these molds, molding was effected by the apparatus of FIG. 9 in the same manner as in Embodiment 17.

Subsequently, the roughness of the surfaces of the molded lenses and the roughness of the surfaces of the molds before and after molding were measured. The result is shown in Table 32 below.

TABLE 32

| No. | Coating | Base material | Roughness of surface Rmax (μm) Lens | Mold (before molding) | Mold (after molding) | Parting property |
|---|---|---|---|---|---|---|
| 88 | None | WC(90%) + Co(10%) | 0.04 | 0.02 | 0.03 | Good |
| 89 | None | SiC | — | 0.04 | — | Fused |
| 90 | SiC | WC(90%) + Co(10%) | — | 0.02 | — | Fused |
| 91 | a-C:H:F | WC(90%) + Co(10%) | 0.03 | 0.02 | 0.02 | Good |
| 92 | a-C:H:F | SiC | 0.05 | 0.04 | 0.04 | Good |
| 93 | a-C:H:F | WC(90%) + Co(10%) | 0.03 | 0.03 | 0.03 | Good |

Subsequently, with respect to Nos. 88, 91, 92 and 93 which did not cause fusion, press-molding was effected 10,000 times on end by the use of the same mold members and by the apparatus shown in FIG. 10. The roughness of the molding surfaces of the mold members at this time and the roughness of the optical surfaces of the molded optical elements are shown in Table 33 below.

TABLE 33

| No. | Number of molding | Roughness of surface Rmax (μm) Lens | Mold |
|---|---|---|---|
| 88 | 200 | 0.14 | 0.15 |
|  | 1000 | 0.20 | 0.21 |
|  | 10000 | 0.26 | 0.27 |
| 91 | 200 | 0.03 | 0.03 |
|  | 1000 | 0.03 | 0.03 |
|  | 10000 | 0.04 | 0.03 |
| 92 | 200 | 0.04 | 0.04 |
|  | 1000 | 0.05 | 0.04 |
|  | 10000 | 0.05 | 0.04 |
| 93 | 200 | 0.03 | 0.03 |
|  | 1000 | 0.03 | 0.03 |
|  | 10000 | 0.03 | 0.03 |

The mold of the present invention is excellent in the parting property with respect to glass and permits mirror surface polishing, and even if it is repetitively used, it suffers very little from the deterioration of its surface as compared with the prior-art mold.

According to the present invention, as described previously with respect to the third object thereof, stabilization of the structure of the amorphous film could be achieved. That is, the present invention could provide a mold which could preclude the activation of dangling bond and could prevent the reaction to lead or the like contained in glass.

4) Description of the Fourth Invention

Description will now be made of some embodiments of the mold having the molding surface thereof coated with an amorphous carbon film having an intermediate layer comprising a carbide of the base material component or an intermediate layer comprising the base material component and an a-C:H.

Embodiment 21

Figure 18:
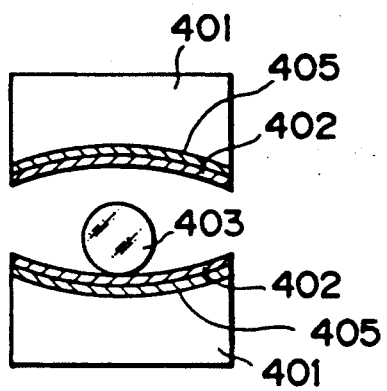
FIGS. 18 to 23 illustrate an embodiment of the mold coated with an a-C:H film having an intermediate layer which is a fourth object of the present invention, FIGS. 18 and 19 being cross-sectional views showing an embodiment of the mold according to the present invention, FIG. 18 showing the state before press-molding, FIG. 19 showing the state after press-molding, FIGS. 20 and 22 being schematic views showing apparatuses used in the method of manufacturing the optical element molding mold according to the present invention, FIGS. 21 and 23 showing main conditions changed when the intermediate layer and a-C:H film are formed, FIG. 21 being a graph showing the relations of the ion gun acceleration voltage and the electron gun current value to the film thickness, and FIG. 23 being a graph showing the relations of the ion gun acceleration voltage and the radio frequency wave output to the film thickness.
Figure 19:
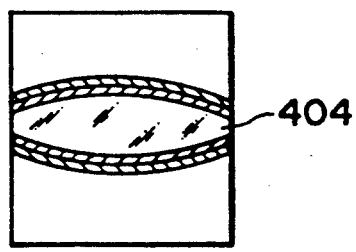

FIGS. 18 and 19 shown an embodiment of the mold according to the present invention.

FIG. 18 shows the state before the press-molding of an optical element, and FIG. 19 shows the state after the molding of the optical element. In FIG. 18, the reference numeral 401 designates a mold base material, the reference numerals 402 and 405 denote a-C:H film and an intermediate layer formed on the molding surfaces of the mold base material which contact with a glass blank, and the reference numeral 403 designates the glass blank, and in FIG. 19, the reference numeral 404 denotes the optical element. By press-molding the glass blank 403 placed between the molds as shown in FIG. 18, the optical element 404 such as a lens is molded as shown in FIG. 19.

Description will now be made in detail of an example of the manufacture of the mold of the present invention. The apparatus used to form the a-C:H film and the intermediate layer is schematically shown in FIG. 20.

Figure 20:
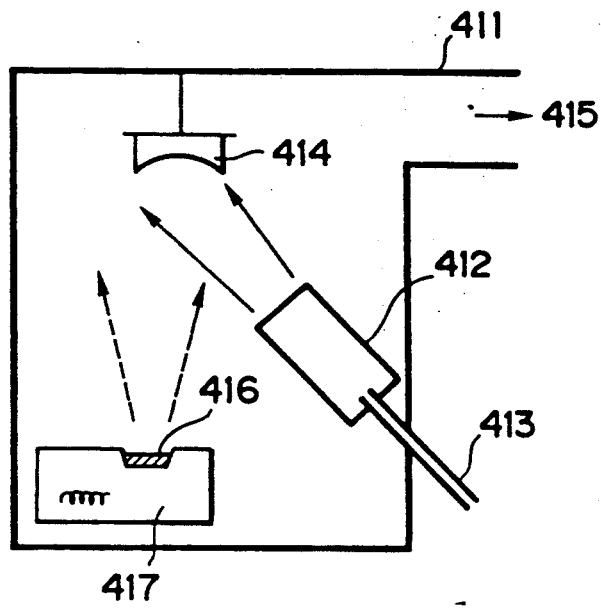

In FIG. 20, the reference numeral 411 designates a vacuum chamber, the reference numeral 412 denotes an ion gun, the reference numeral 413 designates a gas inlet port, the reference numeral 414 denotes a substrate, the reference numeral 415 designates an exhaust port, the reference numeral 416 denotes tungsten, and the reference numeral 417 designates an electron gun.

WC(90%)+Co(10%) was used as the mold base material. The internal pressure of the vacuum chamber 411 was reduced to $1 \times 10^{-6}$ Torr, whereafter Ar gas was introduced from the gas introduction port 413 into the ion gun 412 and was thereby made into an Ar+ ion beam, which was applied to the surface of the substrate (base material) 414 to clean the same.

Thereafter, the intermediate layer was produced. Methane gas was introduced from the gas introduction port into the ion gun, and an acceleration voltage 100 V and an ion current 0.05 mA/cm$^2$ were applied to thereby make the gas into an ion beam while, on the other hand, an electron beam (9 KV, 1 A) was applied from the electron gun 417 to the tungsten 416 of high purity (99.99%) and at the same time, evaporation was effected. The substrate temperature was held at 300° C., and the pressure in the vacuum chamber was $4 \times 10^{-4}$ Torr. The produced intermediate layer had a thickness of 1,000 Å.

The a-C:H film was then formed. Mixture gas of a ratio of CH$_4$/H$_2$=$\frac{1}{2}$ was introduced into the ion gun, an acceleration voltage 600 V was applied, and an ion beam of ion current 0.85 mA/cm$^2$ was applied onto the substrate (base material+intermediate layer) held at a substrate temperature 150° C.

The pressure was $2 \times 10^{-4}$ Torr, and the film thickness of the a-C:H film was 5,000 Å.

Description will now be made in detail of an example in which press-molding of a glass lens was effected by the optical element mold according to the present invention. Table 34 below shows the kinds of the base materials used in the experiment.

TABLE 34

| No. | Coating material | Base material |
|---|---|---|
| 94 | None | WC(90%) + Co(10%) |
| 95 | None | SiC |
| 96 | SiC | WC(90%) + Co(10%) |
| 97 | a-C:H (having intermediate layer) | WC(90%) + Co(10%) |

Nos. 94-96 are comparative materials, and No. 97 is the material proposed by the present invention. The lens molding apparatus used in the same as the apparatus shown in FIG. 9.

First, optical glass of the flint line (SF14) is adjusted to a predetermined amount, a glass blank made into a spherical shape is placed in the cavity of the mold, and this is installed in the apparatus.

The mold in which the glass blank is placed is installed in the apparatus, and then the lid 52 of the vacuum chamber 51 is closed, and water flows into the water cooing pipe 70 and an electric current is supplied to the heaters 58. At this time, the valve 66 for nitrogen gas and vent valve 68 are closed and the exhaust system valves 62, 63 and 64 are also closed. The oil rotating pump 61 is rotating at all times.

The valve 62 is opened to begin exhaust and when the pressure reaches $10^{-2}$ Torr or less, the valve 62 is closed and the valve 66 is opened to introduce nitrogen gas from a cylinder into the vacuum chamber. When a predetermined temperature is reached, the air cylinder 60 is operated to press the glass blank with a pressure of 10 kg/cm$^2$ for five minutes. After the pressure is released, cooling is effected at a cooling speed of −5° C./min until the transition point or below is reached, whereafter cooling is effected at a speed of −20° C./min or higher, and when the temperature falls to 200° C. or below, the valve 66 is closed and the vent valve 63 is opened to introduce air into the vacuum chamber 51. The lid 52 is then opened, the upper mold keeper is removed and the molded article is taken out.

In the manner described above, the lens 404 shown in FIG. 19 was molded by the use of optical glass SF148 of the flint line (the softening point Sp=586° C. and the transition point Tg=485° C.). The condition of molding at this time, i.e., the time-temperature relation, is the same as FIG. 11.

Subsequently, the roughness of the surfaces of the molded lenses and the roughness of the surface of the mold before and after molding were measured. The result is shown in Table 35 below.

TABLE 35

| No. | Coating | Base material | Roughness of surface Rmax (μm) | | | Parting property |
|---|---|---|---|---|---|---|
| | | | Lens | Mold (before molding) | Mold (after molding) | |
| 94 | None | WC(90%) + Co(10%) | 0.04 | 0.02 | 0.03 | Good |
| 95 | None | SiC | — | 0.04 | — | Fused |
| 96 | SiC | WC(90%) + Co(10%) | — | 0.02 | — | Fused |
| 97 | a-C:H (having intermediate layer) | WC(90%) + Co(10%) | 0.03 | 0.02 | 0.02 | Good |

With respect to Nos. 94 and 97 which did not cause fusion, the roughness of the surface was measured after molding was effected 200 times by the use of the same mold. The result is shown in Table 36 below.

TABLE 36

| No. | Roughness of surface Rmax (μm) | |
|---|---|---|
| | Lens | Mold (after 200 times) |
| 94 | 0.14 | 0.15 |
| 97 | 0.03 | 0.02 |

As is apparent from the results shown in Tables 35 and 36 above, the mold material according to the present invention is excellent in the parting property with respect to glass, and even if it is repetitively used, it suffers very little from the deterioration of its surface as compared with the prior-art mold material.

Embodiment 22

Figure 21:
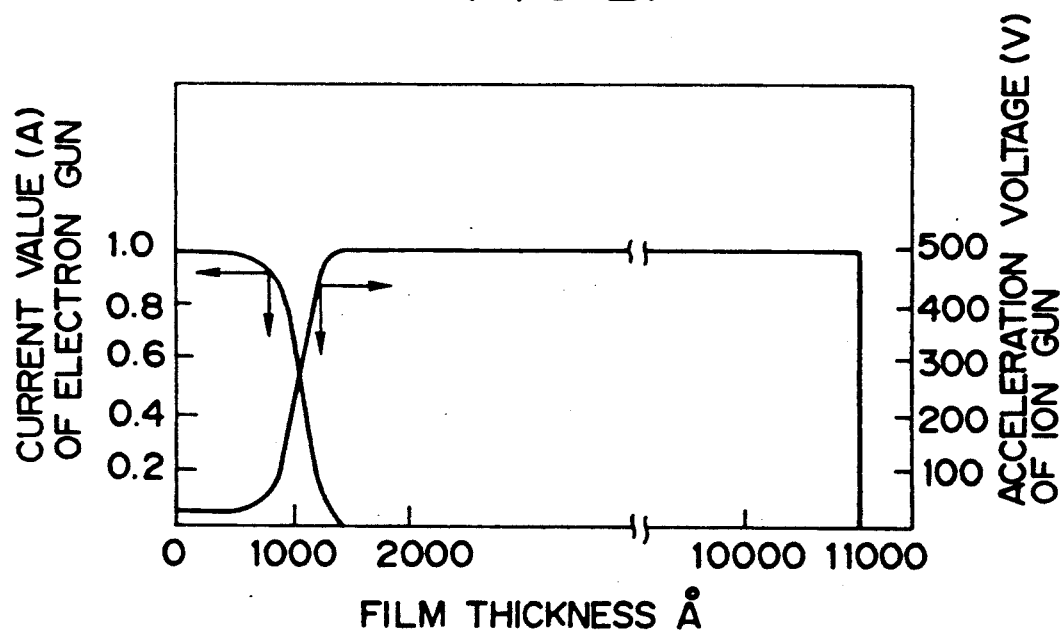

Use was made of a mold base material and an apparatus similar to those used in Embodiment 21. In a similar manner, cleaning of the substrate was effected, whereafter the pressure and the substrate temperature were kept at $4 \times 10^{-4}$ Torr and 150° C., respectively, and methane gas was introduced into the ion gun and an ion beam was applied and at the same time, evaporation of tungsten was effected. The then acceleration voltage of the ion gun and the current value of the ion beam for deposition were varied as shown in FIG. 21, and the intermediate layer and the a-C:H layer were continuously formed into a film of 6,000 Å as a whole.

Description will now be made in detail of an example in which by the use of the apparatus shown in FIG. 10, press-molding of a glass lens was effected by the above-described mold.

Optical glass of the flint line (SF14, the softening point Sp=586° C. and the glass transition point Tg=485° C.) was roughly worked into a predetermined shape and dimensions, whereby a blank for molding was obtained.

The glass blank was installed in the pallet 120 and placed in the position 120-1 in the taking-in replacement chamber 104, and the pallet in this position was pushed in the direction of arrow A by the rod 122 of the cylinder 124 and conveyed to the position 120-2 in the molding chamber 106 beyond the gate valve 112, whereafter in a similar manner, pallets were newly successively placed in the taking-in replacement chamber 104 at predetermined timing, and each time, the pallets were successively conveyed to the positions 120-2→ . . . →120-8 in the molding chamber 106. In the meantime, in the heating zone 106-1, the glass blank was gradually heated by the heater 128 and was rendered to the softening point or below at the position 120-4, whereafter it was conveyed to the press zone 106-2, where the cylinders 138 and 140 were operated to press the glass blank with a pressure of 10 kg/cm² for five minutes by the upper mold member 130 and the lower mold member 132, whereafter the pressure was released and the glass blank was cooled to the glass transition point or below, and thereafter the cylinders 138 and 140 were operated to part the upper mold member 130 and the lower mold member 132 from the molded glass article. During said pressing, said pallet was utilized as a side mold member for molding, whereafter the molded glass article was gradually cooled in the gradually cooling zone 106-3. The molding chamber 106 was filled with inert gas.

The pallet which arrived at the position 120-8 in the molding chamber 106 was then conveyed to the position 120-9 in the deposition chamber 108 beyond the gate valve 114. Usually, vacuum evaporation is effected here, but in the present embodiment, such evaporation was not effected. In the next cycle of conveyance, the pallet was conveyed to the position 120-10 in the taking-out replacement chamber 110 beyond the gate valve 116. During the next cycle of conveyance, the cylinder 150 was operated and the molded glass article was taken out of the molding apparatus 102 by the rod 148.

The roughness of the molding surfaces of the mold 130 and 132 before and after the press-molding as described above, the roughness of the optical surface of the molded optical element and the parting property of the mold 130 and 132 with respect to the molded optical element are shown in Table 37 below.

TABLE 37

| No. | Coating | Base material | Roughness of surface Rmax (μm) | | | Parting property |
|---|---|---|---|---|---|---|
| | | | Lens | Mold (before molding) | Mold (after molding) | |
| 98 | None | WC(90%) + Co(10%) | 0.04 | 0.02 | 0.03 | Good |
| 99 | None | SiC | — | 0.04 | — | Fused |
| 100 | SiC | WC(90%) + Co(10%) | — | 0.02 | — | Fused |
| 101 | a-C:H (having intermediate layer) | WC(90%) + Co(10%) | 0.03 | 0.03 | 0.03 | Good |

Subsequently, with respect to Nos. 98 and 101 which did not cause fusion, press-molding was effected 10,000 times on end by the use of the same mold. The roughness of the molding surfaces of the mold 130 and 132 at this time and the roughness of the optical surface of the molded optical element are shown in table 38 below.

TABLE 38

| No. | Number of molding | Roughness of surface Rmax (μm) | |
|---|---|---|---|
| | | Lens | Mold |
| 98 | 200 | 0.14 | 0.15 |
| | 1000 | 0.20 | 0.21 |
| | 5000 | 0.23 | 0.24 |
| | 10000 | 0.26 | 0.27 |
| 101 | 200 | 0.03 | 0.03 |
| | 1000 | 0.03 | 0.03 |
| | 5000 | 0.03 | 0.03 |
| | 10000 | 0.04 | 0.03 |

As shown above, in the present embodiment, even if the mold was repetitively used for press-molding, good surface accuracy could be maintained sufficiently and optical elements of good surface accuracy could be molded without fusion being caused.

Embodiment 23

Figure 22:
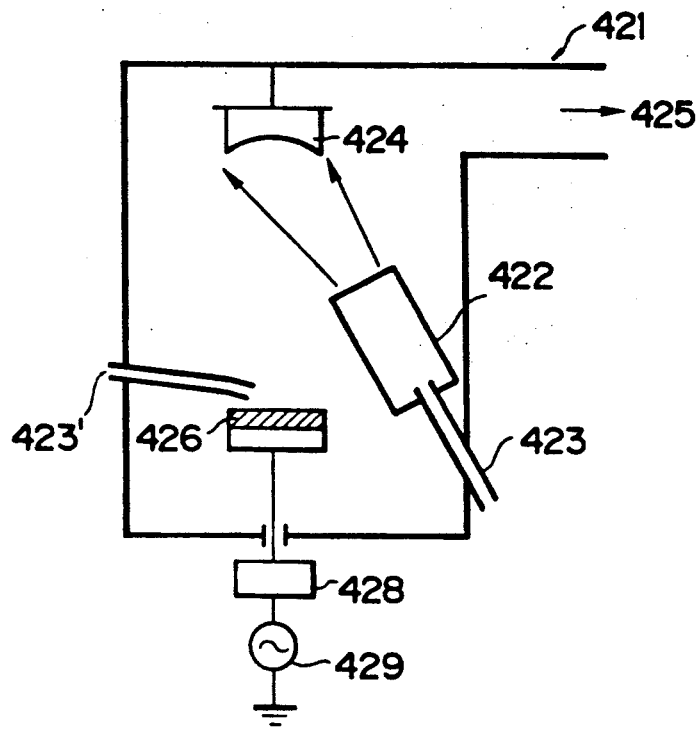

The apparatus used is schematically shown in FIG. 22.

In FIG. 22, the reference numeral 421 designates a vacuum chamber, the reference numeral 422 denotes an ion gun, the reference numerals 423 and 423' designate gas inlet ports, the reference numeral 424 denotes a substrate, the reference numeral 425 designates an exhaust port, the reference numeral 426 denotes tungsten, the reference numeral 427 designates an electron gun, the reference numeral 428 denotes a matching box, and the reference numeral 429 designates an RF power supply.

By the same mold base material as that used in Embodiment 21 and in a similar manner, the substrate (base material) 424 was cleaned by Ar+ ion beam. Thereafter, methane gas at $4 \times 10^{-3}$ Torr was introduced from the gas inlet port 423 into the ion gun 422 and an ion beam was applied to the substrate at an acceleration voltage 100 V and ion current 0.05 mA/cm$^2$. At the same time, argon gas at $4 \times 10^{-4}$ Torr was introduced from the gas inlet port 423' into the vicinity of the tungsten 426 of high purity 99.99%, and an RF of 13.56 MHz and output 1 KW was applied to the tungsten, whereby sputter deposition of the tungsten was effected. The substrate temperature was 150° C. and an intermediate layer was formed to a thickness of 1,000 Å.

Subsequently, a-C:H film was deposited in the same manner as in Embodiment 21, and the film thickness of the whole including the intermediate layer was rendered to 6,000 Å.

When a molding test was carried out by the use of the thus obtained mold and by the use of the apparatus of FIG. 9 as in Embodiment 21, a good result was obtained similarly to the mold No. 97 in Embodiment 21.

Embodiment 24

Figure 23:
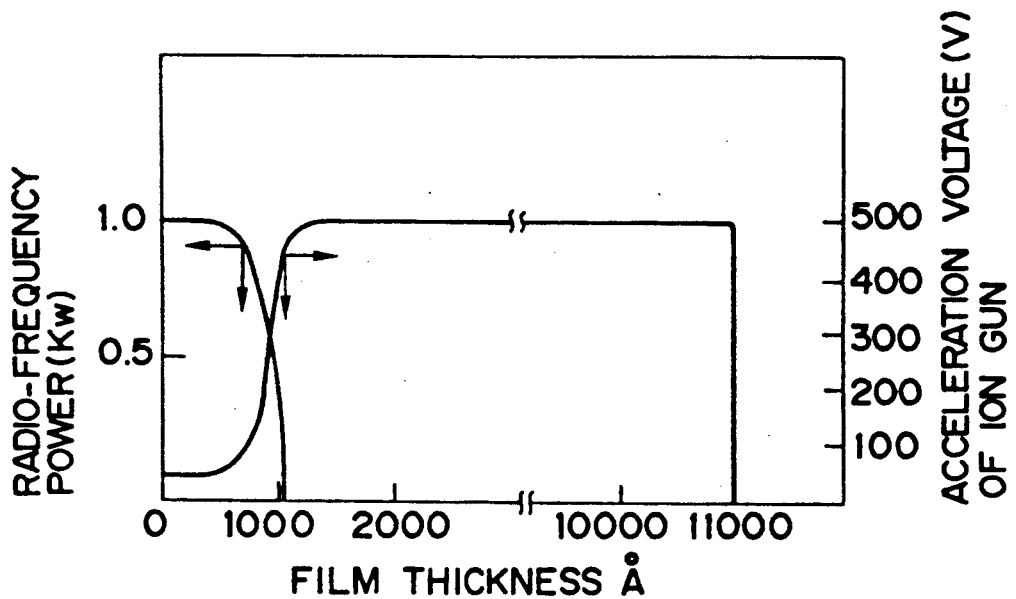

The same mold base material apparatus as that used in Embodiment 23 was used and cleaning of the substrate was effected in a similar manner. Thereafter, methane gas was introduced into the ion gun and made into an ion beam, which was applied, and at the same time, sputtering of the tungsten was effected, but the RF output power and the ion gun acceleration voltage were varied as shown in FIG. 23, and a film was made continuously. The thickness of the entire film was 5,500 Å. The substrate temperature was 150° C., the Ar gas was at $4 \times 10^{-3}$ Torr→0 Torr, the RF (1356 MHz) output power was 1 KW→0 W, the methane gas was at $4 \times 10^{-4}$ Torr, and the acceleration voltage was 50 V→500 V.

When a molding test was carried out by the use of the thus obtained mold and by the use of the apparatus of FIG. 11 as in Embodiment 22, a good result was obtained similarly to the mold No. 101 in Embodiment 22.

The optical element molding mold of the present invention is excellent in the parting property with respect to glass and permits mirror surface polishing, and even if it is repetitively used, it suffers very little from the deterioration of its surface as compared with the prior-art mold.

Where the mold base material is super-hard alloy (WC-Co), Cobalt Co in WC-Co reacts to lead in glass and peeling-off of films occurs during the molding operation.

According to the present invention, the surface of WC-Co is coated with a film intermediate of tungsten (W') and carbon (C).

Particularly, if the rate of tungsten is made great in the lower layer of the intermediate layer and the rate of carbon is made great in the upper layer of the intermediate layer, the reaction of Co in WC-Co of the base material to glass is suppressed by tungsten and therefore, there could be provided a mold which did not cause the reaction to glass.

What is claimed is:

1. A method of manufacturing a mold for molding an optical element by heating and pressing glass material, said method comprising the steps of:

coating an amorphous carbon hydride film on at least a molding surface of a base material of the mold, said film containing hydrogen in the range of 5 to 40 atom percent, and having a film density of at least 1.5 g/cm$^3$;

heat treating said mold base material coated with said amorphous carbon film at a temperature of 400° to 750° C. in an atmosphere of a partial pressure of oxygen less than $1 \times 10^{-1}$ Torr;

forming by said heat treatment, a hard carbon film comprising 0 to 5 atoms percent of hydrogen, having a spin density of less than $1 \times 10^{18}$ spin/cm$^3$ and a film density of at least 1.5 g/cm$^3$, said hard carbon film being coated on said molding surface of said mold.

* * * * *

UNITED STATES PATENT AND TRADEMARK OFFICE
CERTIFICATE OF CORRECTION

PATENT NO. : 5,202,156
DATED : April 13, 1993
INVENTOR(S) : Kiyoshi Yamamoto, et al.

It is certified that error appears in the above-indentified patent and that said Letters Patent is hereby corrected as shown below:

ON TITLE PAGE

In [56] References Cited, under FOREIGN PATENT DOCUMENTS:
"5245613  9/1976  Japan ." should read
--52-45613  4/1977 Japan .--;
"60246230  5/1984  Japan ." should read
--60-246230  12/1985  Japan .--;
"61183134  2/1985  Japan ." should read
--61-183134  8/1986  Japan .--; and
"61281030  6/1985  Japan ." should read
--61-281030  12/1986  Japan .--.

SHEET 1 OF 12

FIG. 2, "BACE" should read --BASE--.

COLUMN 2

Line 62, "become stress" should read --stress becomes--.

COLUMN 4

Line 9, "high interface" should read --high temperature state.  Here, the film portion of the interface--.

COLUMN 6

Line 63, "do" should read --does--.

COLUMN 7

Line 5, "to" should be deleted.

UNITED STATES PATENT AND TRADEMARK OFFICE
CERTIFICATE OF CORRECTION

PATENT NO. : 5,202,156
DATED : April 13, 1993
INVENTOR(S) : KIYOSHI YAMAMOTO, ET AL.

It is certified that error appears in the above-identified patent and that said Letters Patent is hereby corrected as shown below:

COLUMN 7

Line 27, "reduction" should read --reduced--.
    Line 31, "CC" should read --WC--.

COLUMN 9

Line 42, "expansion a" should read --expansion--.
    Line 52, "be-made" should read --be made--.

COLUMN 11

Line 15, "hands" should read --bonds--.
    Line 25, "oxidinized" should read --oxidized--.
    Line 45, "obtained is quick" should read --is quickly obtained--.

COLUMN 13

Line 12, "vacuum" should read --a vacuum--.
    Line 13, "tee" should read --the--.
    Line 67, "thermocouples," should read --thermocouple,--.

COLUMN 15

Line 54, "an" should be deleted.

UNITED STATES PATENT AND TRADEMARK OFFICE
CERTIFICATE OF CORRECTION

PATENT NO. : 5,202,156
DATED : April 13, 1993
INVENTOR(S) : Kiyoshi Yamamoto, et al.

It is certified that error appears in the above-indentified patent and that said Letters Patent is hereby corrected as shown below:

COLUMN 16

Line 52, "or end" should be deleted.

COLUMN 17

Line 17, "heaped up on" should read --formed on--.
Line 49, "effected," should read --affected--.

COLUMN 21

Line 2, "exist" should read --exit--.

COLUMN 22

Line 1, "wherewith after" should read --whereafter--.
Line 61, "hard" should read --had--.

COLUMN 23

Line 16, "tion" should read --tions--.
Line 68, "deposite." should read --deposit.--.

COLUMN 25

TABLE 16, "ratio $H_2Ar$" should read --ratio $H_2/Ar$--.
Line 65, "a" should read --to a--.

COLUMN 26

Line 20, "nor" should read --nor was--.
Line 21, "was" should be deleted.
Line 64, "on end" should read --consecutively--.

UNITED STATES PATENT AND TRADEMARK OFFICE
CERTIFICATE OF CORRECTION

PATENT NO. : 5,202,156
DATED : April 13, 1993
INVENTOR(S) : Kiyoshi Yamamoto, et al.

It is certified that error appears in the above-indentified patent and that said Letters Patent is hereby corrected as shown below:

COLUMN 27

Line 31, "deposite" should read --deposit--.
Line 47, "on end" should be deleted.

COLUMN 28

Line 29, "on end" should be deleted.

COLUMN 29

Line 1, "of inhomogeneous," should read --not homogeneous,--.
Line 35, "plainner" should read --planar--.

COLUMN 30

Line 27, "6" should read --66--.
Line 49, "then" should be deleted.
Line 50, "same" should be deleted and "as the" should read --is the same as the--.
Line 59, "measured" should read --thereafter measured--.

COLUMN 33

Line 63, "obtain" should read --obtained--.

COLUMN 35

Line 11, "rent" should read --vent--.

UNITED STATES PATENT AND TRADEMARK OFFICE
CERTIFICATE OF CORRECTION

PATENT NO. : 5,202,156
DATED : April 13, 1993
INVENTOR(S) : Kiyoshi Yamamoto, et al.

It is certified that error appears in the above-indentified patent and that said Letters Patent is hereby corrected as shown below:

COLUMN 36

Line 53, "as" should read --was--.
Line 55, "filed" should read --field--.

COLUMN 37

Line 24, "Ha re" should read --H are--.
Line 31, "gun" should read --guns--.
Line 34, "pots," should read --ports,--.

COLUMN 41

Line 42, "$CH_4/H_2=\frac{1}{2}$" should read --$CH_4/H_2=1/2$--.

COLUMN 42

Line 11, "used in" should read --used is--.

COLUMN 43

Line 23, "then" should be deleted.

COLUMN 45

Line 41, "(1356 MHz)" should read --13.56 MHz--.

UNITED STATES PATENT AND TRADEMARK OFFICE
CERTIFICATE OF CORRECTION

PATENT NO. : 5,202,156
DATED : April 13, 1993
INVENTOR(S) : Kiyoshi Yamamoto, et al.

It is certified that error appears in the above-indentified patent and that said Letters Patent is hereby corrected as shown below:

<u>COLUMN 46</u>

Line 37, "Torr;" should read --Torr; and--.
    Line 39, "atoms" should read --atom--.

Signed and Sealed this

Tenth Day of January, 1995

Attest:

BRUCE LEHMAN

Attesting Officer     Commissioner of Patents and Trademarks